(12) United States Patent
Kim et al.

(10) Patent No.: US 12,308,245 B2
(45) Date of Patent: May 20, 2025

(54) METHOD OF FABRICATING SEMICONDUCTOR DEVICE INCLUDING POROUS DIELECTRIC LAYER

(71) Applicant: SAMSUNG ELECTRONICS CO., LTD., Suwon-si (KR)

(72) Inventors: Jongcheon Kim, Seoul (KR); Hyunchul Lee, Hwaseong-si (KR); Ki-Jeong Kim, Seongnam-si (KR); Donghwi Shin, Yongin-si (KR); Hyun-Sil Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 592 days.

(21) Appl. No.: 17/698,476

(22) Filed: Mar. 18, 2022

(65) Prior Publication Data

US 2023/0069868 A1 Mar. 9, 2023

(30) Foreign Application Priority Data

Sep. 8, 2021 (KR) ........................ 10-2021-0119961

(51) Int. Cl.
*H01L 21/311* (2006.01)
*H01L 21/027* (2006.01)
*H01L 21/768* (2006.01)
*H01L 23/522* (2006.01)
*H01L 23/528* (2006.01)

(52) U.S. Cl.
CPC .... *H01L 21/31144* (2013.01); *H01L 21/0273* (2013.01); *H01L 21/76816* (2013.01); *H01L 21/76832* (2013.01); *H01L 23/5226* (2013.01); *H01L 23/528* (2013.01)

(58) Field of Classification Search
None
See application file for complete search history.

(56) References Cited

U.S. PATENT DOCUMENTS

| 7,105,454 B2 | 9/2006 | Ho et al. |
| 9,171,731 B2 * | 10/2015 | Huang ................. H01L 21/306 |
| 9,312,222 B2 | 4/2016 | Ting et al. |

(Continued)

FOREIGN PATENT DOCUMENTS

| EP | 3301705 A1 | 9/2017 |
| KR | 10-0428791 B1 | 4/2004 |

OTHER PUBLICATIONS

Munehiro Tada, et al., IEEE Transactions On Electron Devices, vol. 54, No. 4, 797-806, Apr. 2007.

*Primary Examiner* — Nduka E Ojeh
(74) *Attorney, Agent, or Firm* — Muir Patent Law, PLLC

(57) ABSTRACT

A method of fabricating a semiconductor device and a device fabricated thereby, the method including sequentially stacking an interlayer insulating layer, a porous dielectric layer, a first mask layer, and a second mask layer on a substrate; etching the second mask layer to form preliminary mask patterns; etching the preliminary mask patterns to form second mask patterns; etching the first mask layer using the second mask patterns as an etch mask to form first mask patterns; etching the porous dielectric layer using the first mask patterns as an etch mask to form grooves; and forming interconnection patterns in the grooves, respectively, wherein the porous dielectric layer includes SiOCH, and the first mask layer includes carbon-free silicon oxide ($SiO_2$).

19 Claims, 21 Drawing Sheets

(56) References Cited

U.S. PATENT DOCUMENTS

| | | | |
|---|---|---|---|
| 9,659,811 | B1 | 5/2017 | Peng et al. |
| 10,510,584 | B2 | 12/2019 | Shiu et al. |
| 2003/0199169 | A1 | 10/2003 | Jun et al. |
| 2008/0230516 | A1* | 9/2008 | Cho .................. H01L 21/31122 216/47 |
| 2015/0091172 | A1 | 4/2015 | Ko et al. |
| 2018/0096857 | A1 | 4/2018 | Zhou |
| 2020/0090984 | A1 | 3/2020 | Chen et al. |
| 2023/0005788 | A1* | 1/2023 | Lee .................... H01L 23/5226 |

* cited by examiner

METHOD OF FABRICATING SEMICONDUCTOR DEVICE INCLUDING POROUS DIELECTRIC LAYER

CROSS-REFERENCE TO RELATED APPLICATION

This U.S. non-provisional patent application claims priority under 35 U.S.C. § 119 to Korean Patent Application No. 10-2021-0119961, filed on Sep. 8, 2021, in the Korean Intellectual Property Office, the entire contents of which are hereby incorporated by reference.

BACKGROUND

1. Field

Embodiments relate to a method of fabricating a semiconductor device including a porous dielectric layer and a semiconductor device fabricated thereby.

2. Description of the Related Art

Due to their small-sized, multifunctional, and/or low-cost characteristics, semiconductor devices are being esteemed as important elements in the electronics industry. With the advancement of the electronic industry, there is an increasing demand for a semiconductor device with higher integration density.

SUMMARY

The embodiments may be realized by providing a method of fabricating a semiconductor device, the method including sequentially stacking an interlayer insulating layer, a porous dielectric layer, a first mask layer, and a second mask layer on a substrate; etching the second mask layer to form preliminary mask patterns; etching the preliminary mask patterns to form second mask patterns; etching the first mask layer using the second mask patterns as an etch mask to form first mask patterns; etching the porous dielectric layer using the first mask patterns as an etch mask to form grooves; and forming interconnection patterns in the grooves, respectively, wherein the porous dielectric layer includes SiOCH, and the first mask layer includes carbon-free silicon oxide ($SiO_2$).

The embodiments may be realized by providing a method of fabricating a semiconductor device, the method including sequentially stacking an interlayer insulating layer, a porous dielectric layer, a first mask layer, and a second mask layer on a substrate; etching the second mask layer to form preliminary mask patterns; etching the preliminary mask patterns to form second mask patterns; etching the first mask layer using the second mask patterns as an etch mask to form first mask patterns; etching the porous dielectric layer using the first mask patterns as an etch mask to form grooves; and forming interconnection patterns in the grooves, respectively, wherein forming the first mask patterns reduces a thickness of the second mask patterns, and etching the porous dielectric layer includes a first etching step of removing the second mask patterns having the reduced thickness; a second etching step of etching the porous dielectric layer to a depth such that the interlayer insulating layer is not exposed; and a third etching step of exposing the interlayer insulating layer and expanding a space between the first mask patterns.

The embodiments may be realized by providing a method of fabricating a semiconductor device, the method including sequentially stacking interlayer insulating layer, a porous dielectric layer, a first mask layer, and a second mask layer on a substrate; etching the second mask layer to form preliminary mask patterns; etching the preliminary mask patterns to form second mask patterns; etching the first mask layer using the second mask patterns as an etch mask to form first mask patterns; etching the porous dielectric layer using the first mask patterns as an etch mask to form grooves exposing the interlayer insulating layer; and forming interconnection patterns in the grooves, respectively, wherein etching the porous dielectric layer includes performing a first etching step, a second etching step, and a third etching step, the first etching step, the second etching step, and the third etching step being performed under different process conditions.

The embodiments may be realized by providing a semiconductor device including an interlayer insulating layer, a first porous dielectric layer, a first etch stop layer, and a second porous dielectric layer sequentially stacked on a substrate; contact plugs in the interlayer insulating layer; first interconnection patterns in the first porous dielectric layer, at least a portion of the first interconnection patterns being adjacent to the contact plugs; and second interconnection patterns in the second porous dielectric layer, wherein a number of the first interconnection patterns per unit area is greater than a number of the second interconnection patterns per the unit area, a width of each of the first interconnection patterns is smaller than a width of the second interconnection pattern, and a dielectric constant of the first porous dielectric layer is smaller than a dielectric constant of the second porous dielectric layer.

The embodiments may be realized by providing a semiconductor device including an interlayer insulating layer, a first porous dielectric layer, a first etch stop layer, and a second porous dielectric layer sequentially stacked on a substrate; contact plugs in the interlayer insulating layer; first interconnection patterns in the first porous dielectric layer, at least a portion of the first interconnection patterns being adjacent to the contact plugs; and second interconnection patterns in the second porous dielectric layer, wherein a number of the first interconnection patterns per unit area is larger than a number of the second interconnection patterns per the unit area, a width of each of the first interconnection patterns is smaller than a width of the second interconnection pattern, and a porosity of the first porous dielectric layer is greater than a porosity of the second porous dielectric layer.

The embodiments may be realized by providing a semiconductor device including a substrate including a cell region and a peripheral region; bit lines on the cell region of the substrate; storage node contacts between the bit lines; bottom electrodes on the storage node contacts; a top electrode covering the bottom electrodes; and a dielectric layer between the top electrode and the bottom electrodes; a peripheral transistor on the peripheral region of the substrate; an interlayer insulating layer covering the top electrode and the peripheral transistor; a first contact penetrating the interlayer insulating layer and connected to the peripheral transistor; a second contact penetrating the interlayer insulating layer and in contact with the top electrode; a first porous dielectric layer, a first etch stop layer, and a second porous dielectric layer sequentially stacked on the interlayer insulating layer; first interconnection patterns in the first porous dielectric layer, at least a portion of the first interconnection patterns being in contact with the first and second contacts; and second interconnection patterns in the second porous dielectric layer, wherein a number of the first interconnection patterns per unit area is greater than a number of the second interconnection patterns per the unit area, a width of each of the first interconnection patterns is smaller than a width of the second interconnection pattern, and a dielectric constant of the first porous dielectric layer is smaller than a dielectric constant of the second porous dielectric layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
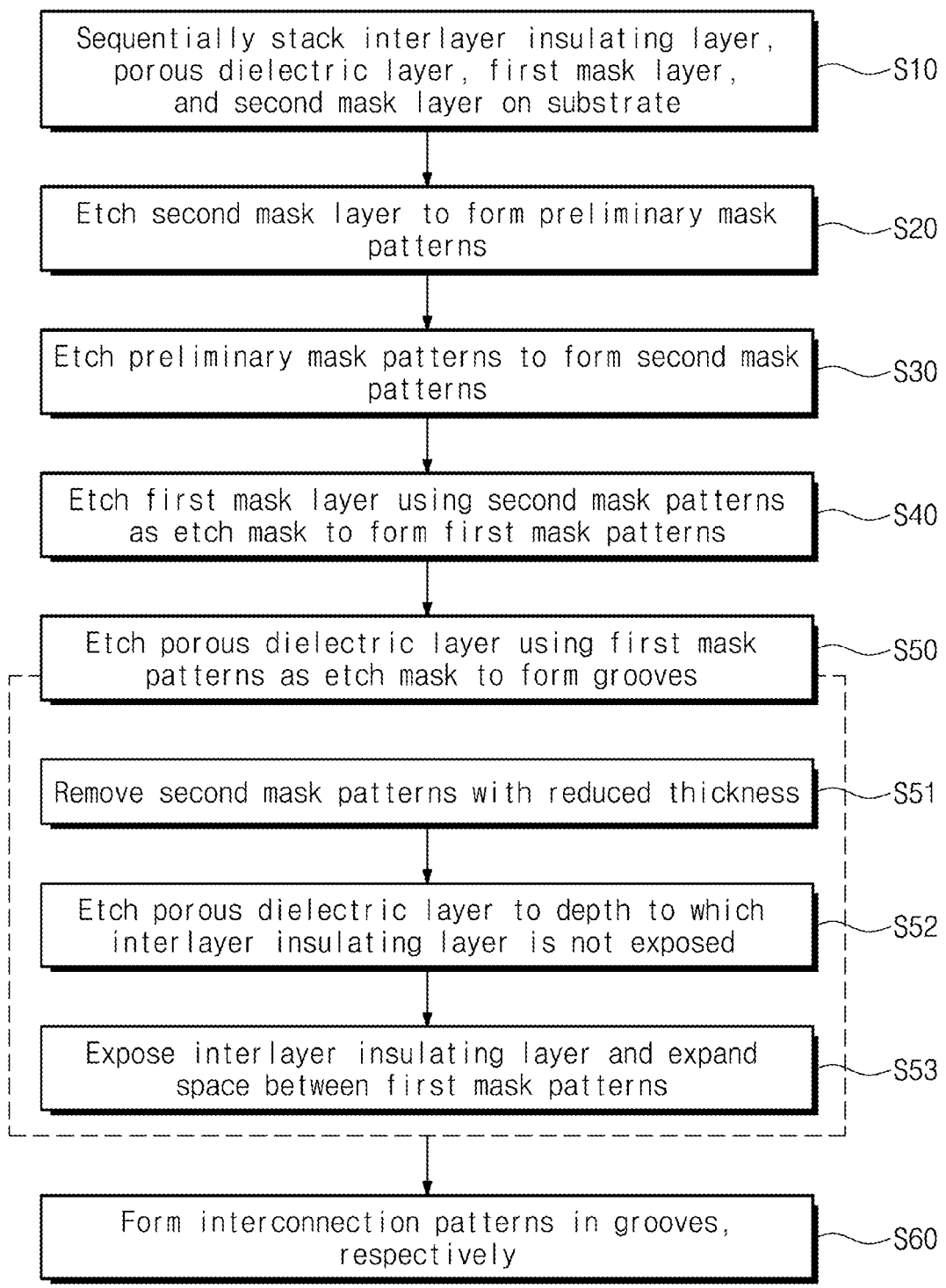
FIG. 1 is a flow chart of a method of fabricating a semiconductor device according to an embodiment.

FIG. 1 is a flow chart of a method of fabricating a semiconductor device according to an embodiment. FIGS. 2A to 2L are sectional views of stages in a method of fabricating a semiconductor device according to an embodiment.

Figure 2A:
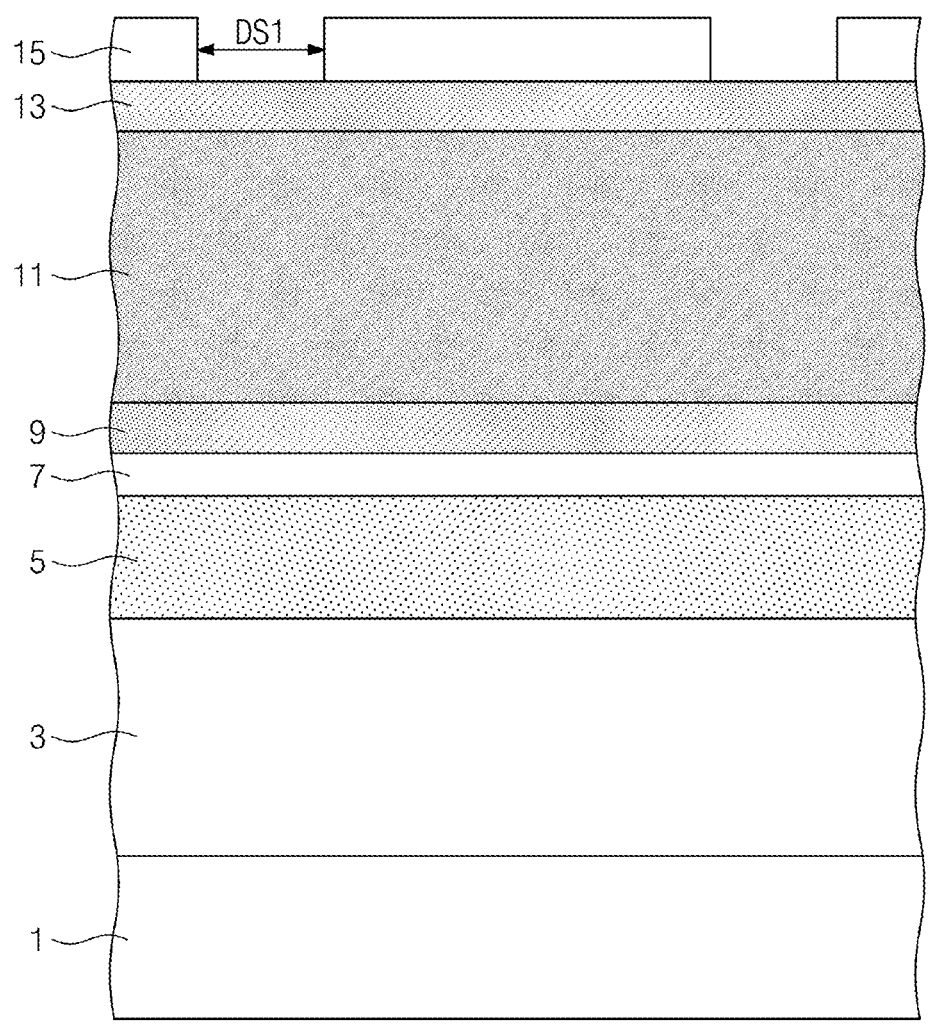
FIGS. 2A to 2L are sectional views of stages in a method of fabricating a semiconductor device according to an embodiment.

Referring to FIGS. 1 and 2A, an interlayer insulating layer 3, a porous dielectric layer 5, a first mask layer 7, and a second mask layer 9 may be sequentially stacked on a substrate 1 (in S10). In an implementation, the substrate 1 may be a single-crystalline silicon substrate or a silicon-on-insulator (SOI) substrate. The interlayer insulating layer 3 may be formed of or include silicon oxide, silicon nitride, or silicon oxynitride, and may have a single-layer structure or a multi-layered structure. The porous dielectric layer 5 may have a dielectric constant that is lower than a dielectric constant of silicon oxide (e.g., about 3.6). In an implementation, the porous dielectric layer 5 may have a dielectric constant of 2.7 to 3.2. The porous dielectric layer 5 may have a porosity of about 5% to about 10%. The porous dielectric layer 5 may be formed of or include, e.g., SiOCH. In an implementation, the first mask layer 7 may be formed of or include, e.g., carbon-free silicon oxide. A density of the first mask layer 7 may be higher than a density of the porous dielectric layer 5. In an implementation, the first mask layer 7 may be deposited by a chemical vapor deposition (CVD) or atomic layer deposition (ALD) method, in which supplying tetraethyl orthosilicate (TEOS) is supplied as a source gas. The second mask layer 9 may be formed of or include, e.g., silicon nitride. As used herein, the term "or" is not an exclusive term, e.g., "A or B" would include A, B, or A and B.

A first sacrificial mask layer 11 and a second sacrificial mask layer 13 may be sequentially stacked on the second mask layer 9. The first sacrificial mask layer 11 may be formed of or include a material (e.g., a spin-on-hardmask (SOH) material) having an etch selectivity with respect to the second mask layer 9. The second sacrificial mask layer 13 may be formed of or include a material (e.g., SiON), which is chosen to have not only an anti-reflection function but also an etch selectivity with respect to the first sacrificial mask layer 11. First photoresist patterns 15 may be formed on the first sacrificial mask layer 11 (e.g., on the second sacrificial mask layer 13 that is on the first sacrificial mask layer 11). The first photoresist patterns 15 may be formed by a photolithography process. The first photoresist patterns 15 may be spaced apart from each other by a first distance DS1. The first photoresist patterns 15 may be line-shaped patterns that extend (e.g., lengthwise) in a specific direction and are parallel to each other.

Figure 2B:
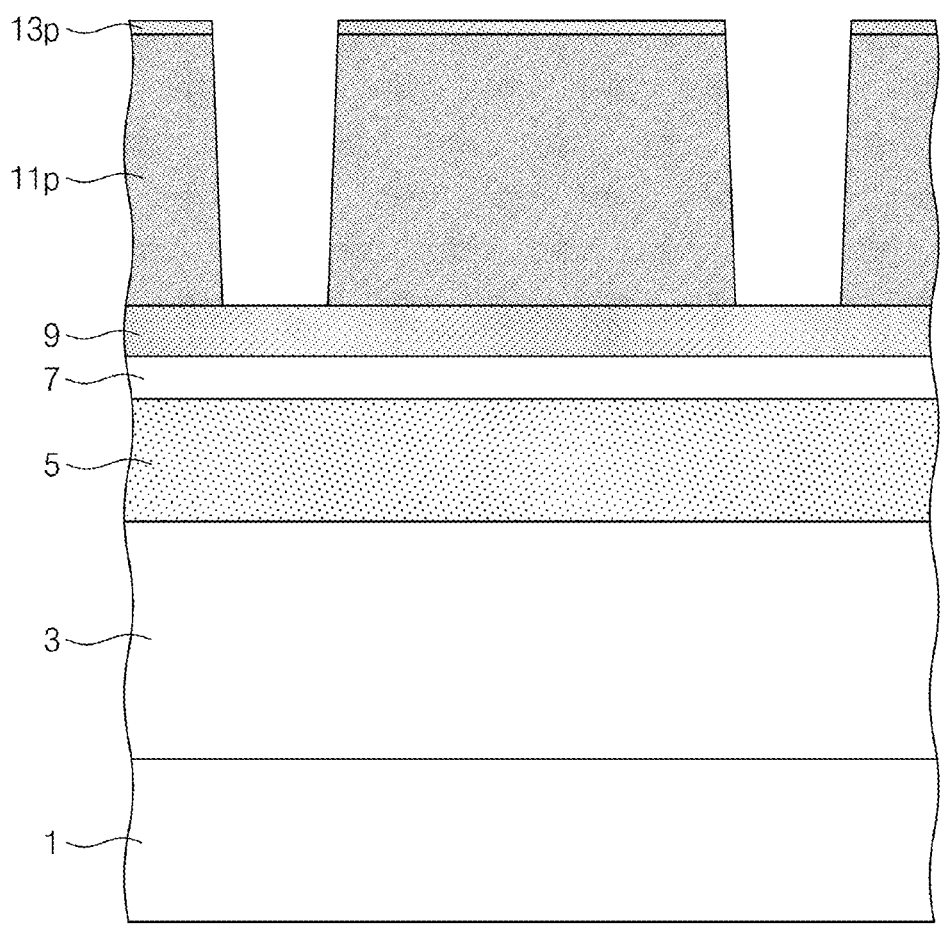

Referring to FIG. 2B, second sacrificial mask patterns 13p may be formed by etching the second sacrificial mask layer 13 using the first photoresist patterns 15 as an etch mask. A thickness of the first photoresist patterns 15 may be reduced during the formation of the second sacrificial mask patterns 13p. First sacrificial mask patterns 11p may be formed by etching the first sacrificial mask layer 11 using the second sacrificial mask patterns 13p as an etch mask. During the formation of the first sacrificial mask patterns 11p, all of the first photoresist patterns 15 may be removed, and a thickness of the second sacrificial mask patterns 13p may be reduced.

Figure 2C:
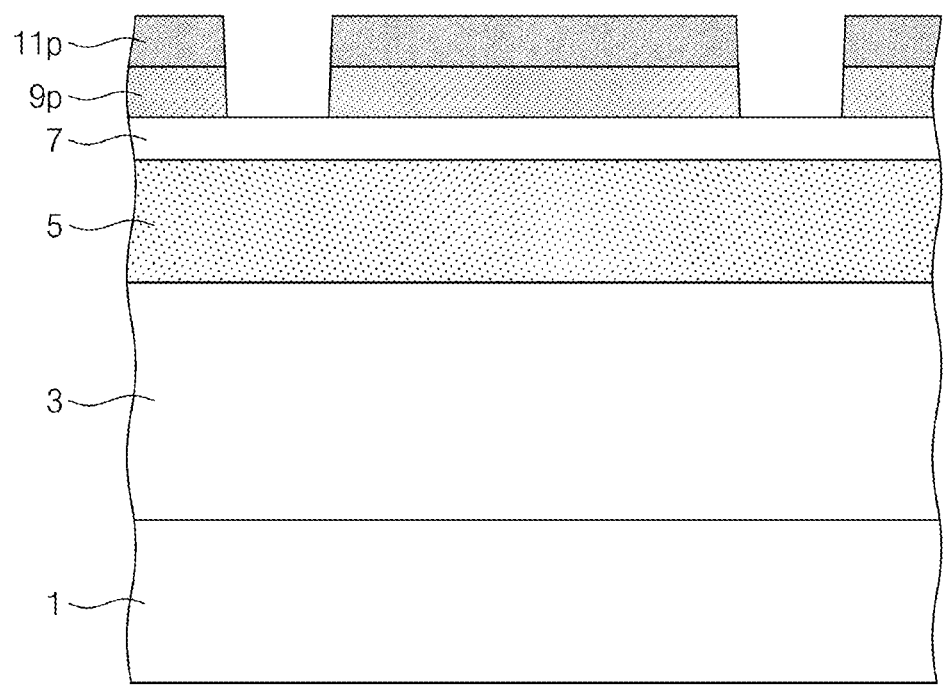

Referring to FIGS. 1 and 2C, preliminary mask patterns 9p may be formed by etching the second mask layer 9 using the first sacrificial mask patterns 11p as an etch mask (in S20). In an implementation, during the formation of the preliminary mask patterns 9p, all of the second sacrificial mask patterns 13p may be removed, and a thickness of the first sacrificial mask patterns 11p may also be reduced. A top surface of the first mask layer 7 between the preliminary mask patterns 9p may be exposed, after or by the formation of the preliminary mask patterns 9p.

Figure 2D:
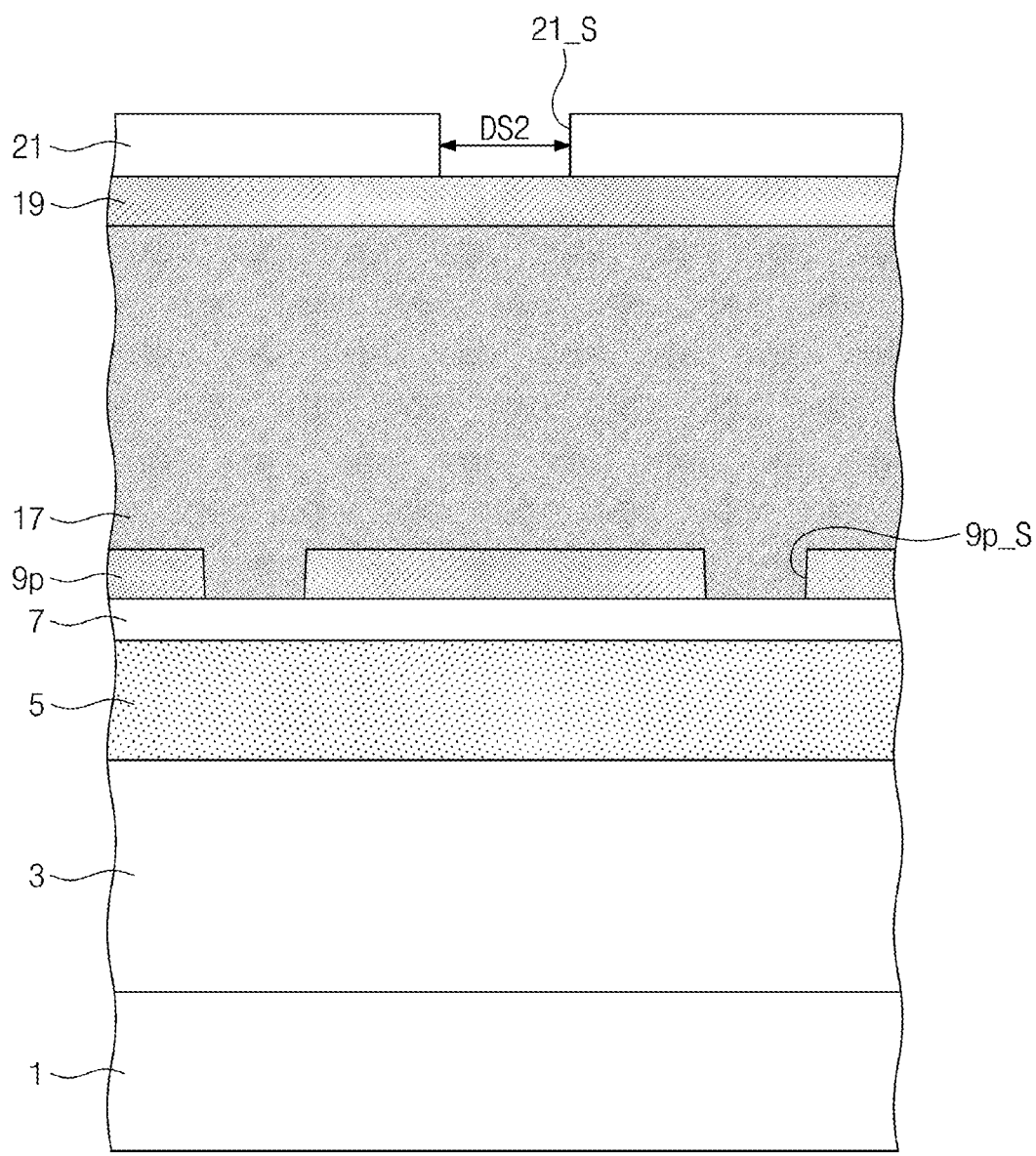

Referring to FIGS. 2C and 2D, the first sacrificial mask patterns 11p may be removed to expose top surfaces of the preliminary mask patterns 9p. In a case where the first sacrificial mask patterns 11p are formed of SOH, the first sacrificial mask patterns 11p may be removed by an ashing process using oxygen. In an implementation, the first mask layer 7 may be formed of silicon oxide having a higher density than that of the porous dielectric layer 5, and the oxygen in the ashing process may be prevented from penetrating into the porous dielectric layer 5.

Referring to FIG. 2D, a third sacrificial mask layer 17 and a fourth sacrificial mask layer 19 may be sequentially stacked on the preliminary mask patterns 9p. The third sacrificial mask layer 17 may be formed of or include a material that has a good gapfill property and may be formed to have a flat top surface. In an implementation, the third sacrificial mask layer 17 may be formed of or include the same material as the first sacrificial mask layer 11 of FIG. 2A. In an implementation, the third sacrificial mask layer 17 may be formed of or include a SOH material. The fourth sacrificial mask layer 19 may be formed of or include a material which is chosen to have not only an anti-reflection function but also an etch selectivity with respect to the third sacrificial mask layer 17. In an implementation, the fourth sacrificial mask layer 19 may be formed of or include the same material as the second sacrificial mask layer 13 of FIG. 2A.

Second photoresist patterns 21 may be formed on the fourth sacrificial mask layer 19. The second photoresist patterns 21 may be formed by a photolithography process. The second photoresist patterns 21 may be spaced apart from each other in a second distance DS2. The second distance DS2 may be about equal to the first distance DS1 of FIG. 1. The second photoresist patterns 21 may be line-shaped patterns that extend in a specific direction and are parallel to each other. As shown in FIG. 2D, the second photoresist patterns 21 may have side surfaces 21_S that overlap with the preliminary mask patterns 9p (e.g., in a vertical direction orthogonal to a top surface of the substrate 1). Side surfaces 9p_S of the preliminary mask patterns 9p may overlap (e.g., may be vertically aligned) with the second photoresist patterns 21. A space between the second photoresist patterns 21 may overlap with a center of the preliminary mask pattern 9p.

Figure 2E:
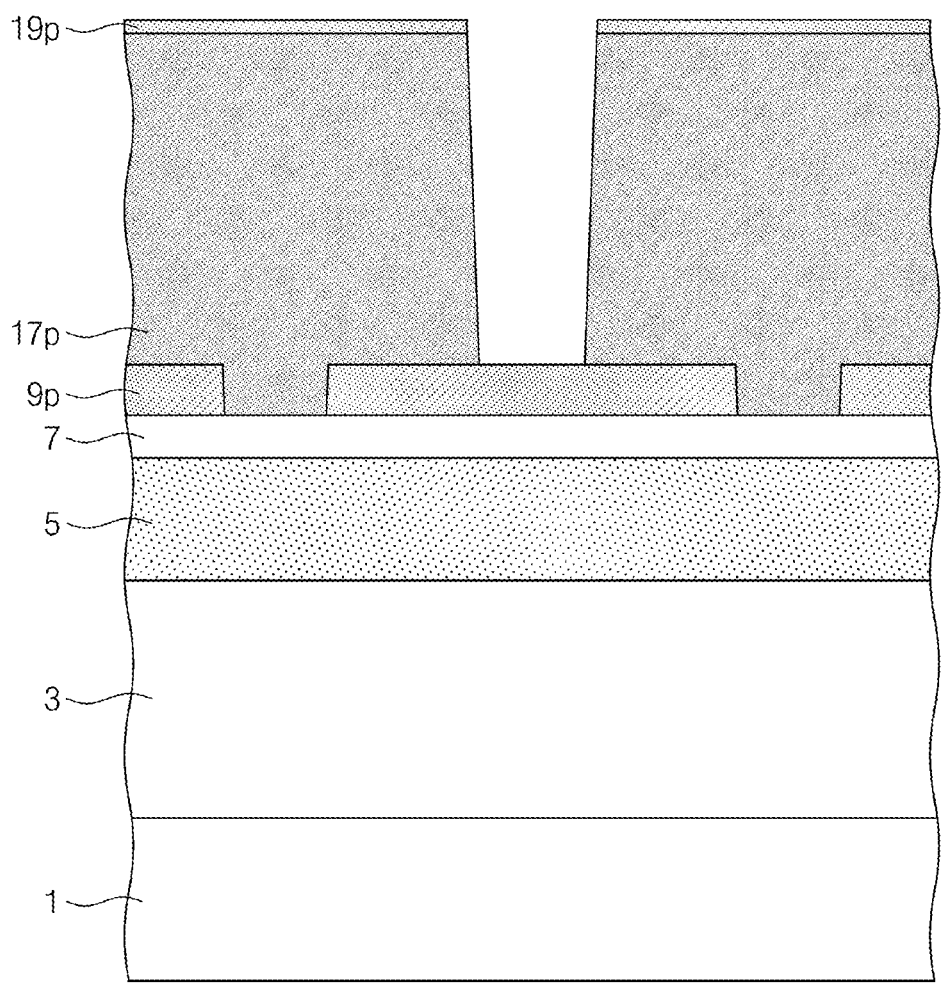

Referring to FIGS. 2D and 2E, fourth sacrificial mask patterns 19p may be formed by etching the fourth sacrificial mask layer 19 using the second photoresist patterns 21 as an etch mask. A thickness of the second photoresist patterns 21 may be reduced during the formation of the fourth sacrificial mask patterns 19p. Third sacrificial mask patterns 17p may be formed by etching the third sacrificial mask layer 17 using the fourth sacrificial mask patterns 19p as an etch mask. In an implementation, the third sacrificial mask patterns 17p may expose top surfaces of the preliminary mask patterns 9p. During the formation of the third sacrificial mask patterns 17p, all of the second photoresist patterns 21 may be removed, and a thickness of the fourth sacrificial mask patterns 19p may also be reduced.

Figure 2F:
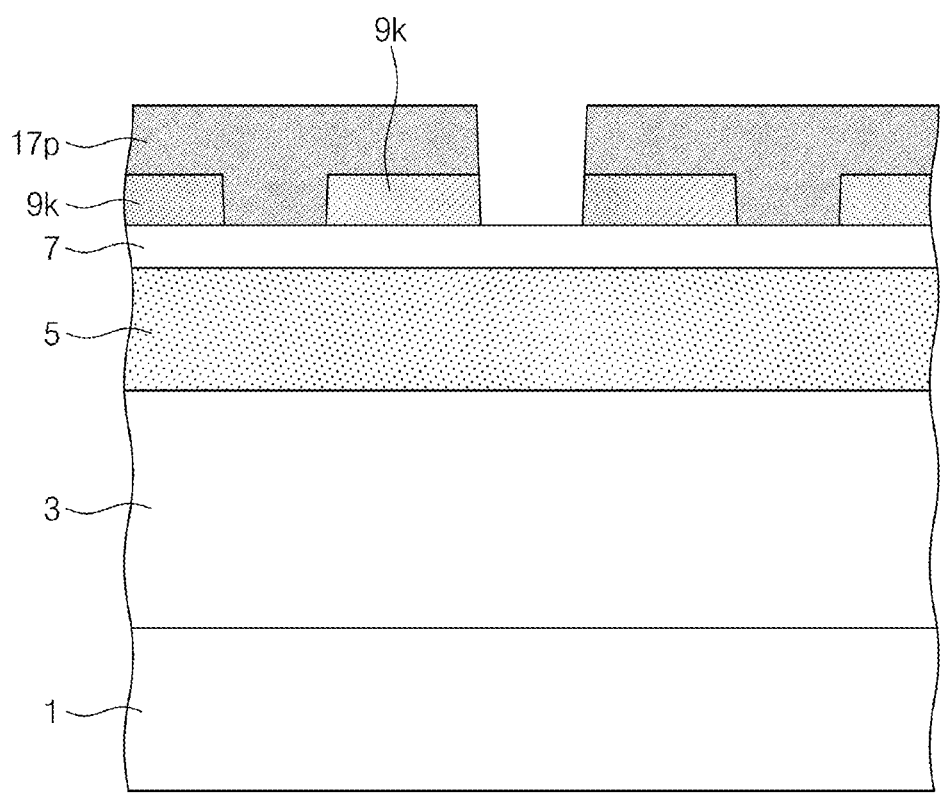

Referring to FIGS. 1 and 2F, second mask patterns 9k may be formed by etching the preliminary mask patterns 9p using the third sacrificial mask patterns 17p as an etch mask (in S30). In an implementation, the second mask patterns 9k may have widths that are smaller than widths of the preliminary mask patterns 9p. In an implementation, the first and second photoresist patterns 15 and 21 may be respectively formed at different positions and etching processes may be performed using them, and fine patterns (e.g., the second mask patterns 9k) may be formed to have a size, which is smaller than the minimum pattern size that could be realized by an exposure process. The first mask layer 7 between the second mask patterns 9k may be exposed to the outside.

Figure 2G:
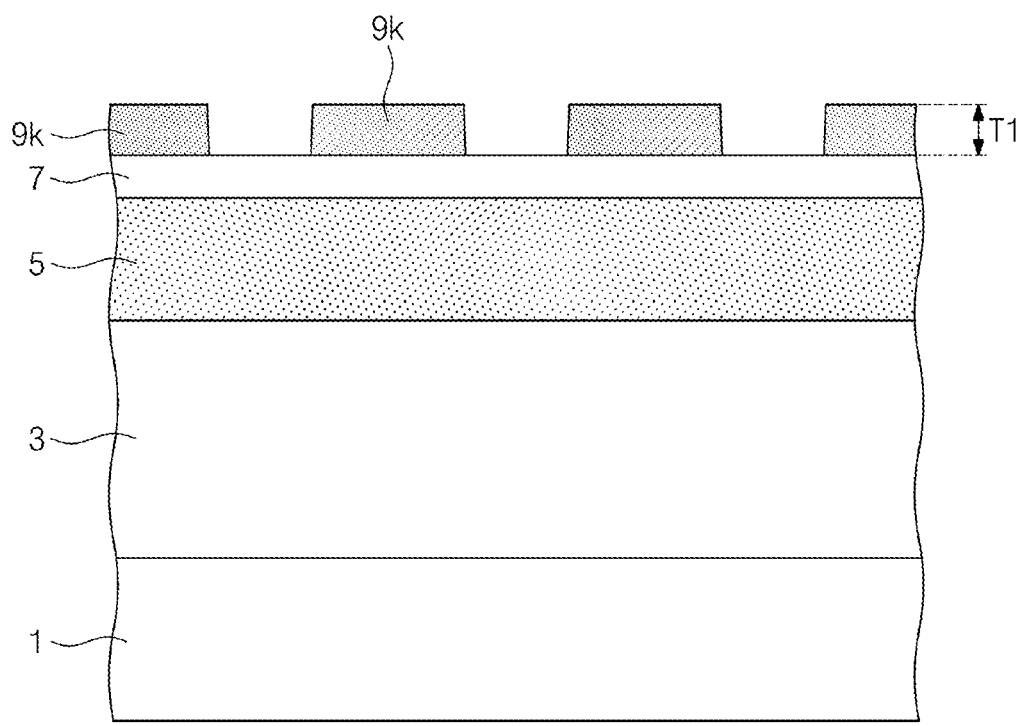

Referring to FIGS. 2F and 2G, the third sacrificial mask patterns 17p may be removed to expose top and side surfaces of the second mask patterns 9k and portions of the top surface of the first mask layer 7. In the case where the third sacrificial mask patterns 17p are formed of a SOH material, the third sacrificial mask patterns 17p may be removed by performing an ashing process using oxygen. In an implementation, the first mask layer 7 may be formed of silicon oxide having a higher density than that of the porous dielectric layer 5, and the oxygen in the ashing process may be prevented from penetrating into the porous dielectric layer 5. Each of the second mask patterns 9k may have a first thickness T1.

Figure 2H:
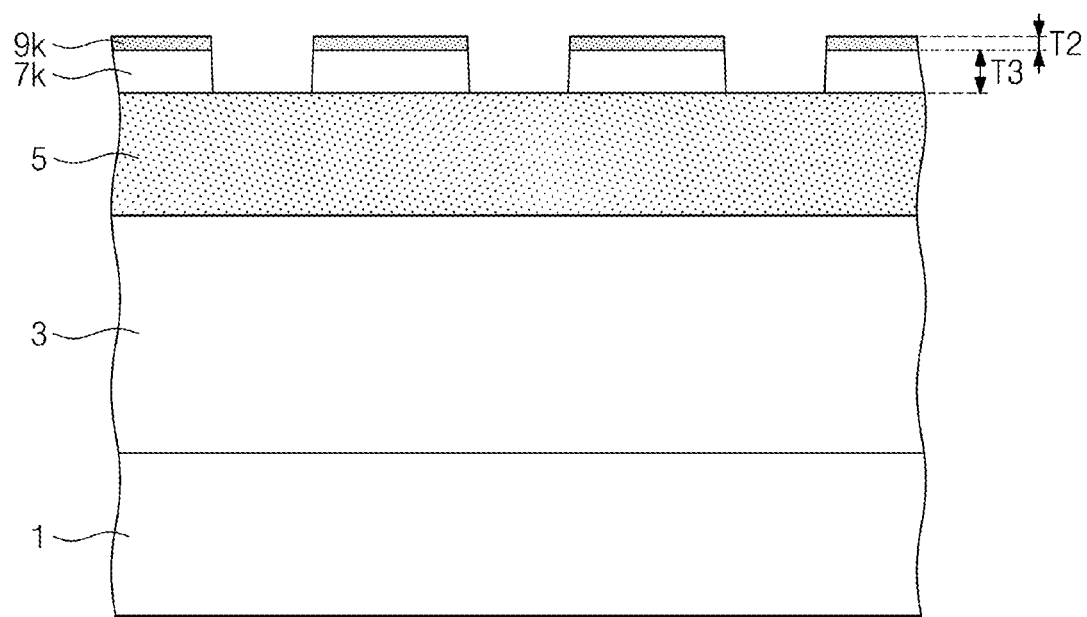

Referring to FIGS. 1 and 2H, first mask patterns 7k may be formed by etching the first mask layer 7 using the second mask patterns 9k as an etch mask (in S40). In an implementation, the first mask patterns 7k may expose (e.g., portions of) the porous dielectric layer 5. During the formation of the first mask patterns 7k, the second mask patterns 9k may be partially etched to have a second thickness T2 that is smaller than the first thickness T1 of FIG. 2G. The first mask patterns 7k may have a third thickness T3.

Referring to FIGS. 1 and 2H to 2J, grooves GR may be formed by etching the porous dielectric layer 5 using the first mask patterns 7k as an etch mask (in S50). In an implementation, the porous dielectric layer 5 may be formed of or include SiOCH, and the first mask patterns 7k may be formed of or include carbon-free $SiO_2$. In an implementation, the first mask patterns 7k may be formed of a carbon-free material, and it may be possible to increase an etch selectivity of the first mask patterns 7k with respect to the porous dielectric layer 5 (which contains carbon). Thus, it may be possible to more accurately form the grooves GR.

Figure 2I:
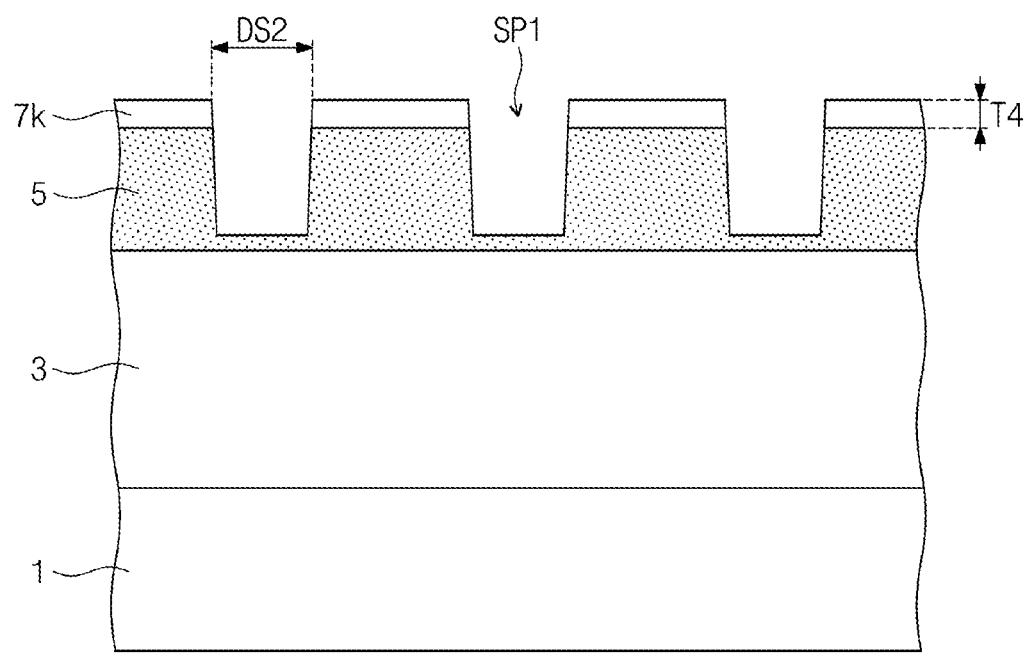
Figure 2J:
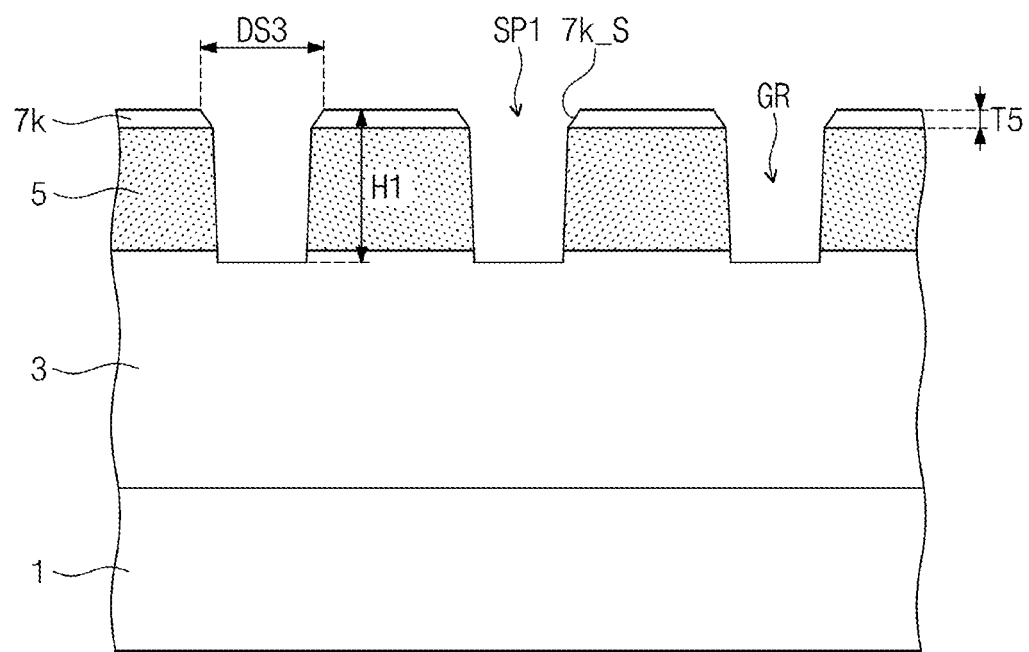

The formation of the grooves GR (in S50) may include sequentially performing first to third etching steps S51, S52, and S53. The first etching step S51 may include removing the second mask patterns 9k (which already has the reduced thickness), and the second etching step S52 may include etching the porous dielectric layer 5 to a depth such that the interlayer insulating layer 3 is not exposed (e.g., such that the porous dielectric layer 5 is not completely penetrated), as shown in FIG. 2I. During the etching of the porous dielectric layer 5, the third thickness T3 of the first mask patterns 7k of FIG. 2H may be reduced to a fourth thickness T4 (e.g., the first mask patterns 7k may be partially etched), as shown in FIG. 2I. In an implementation, upper portions of the first mask patterns 7k may be spaced apart from each other by the second distance DS2, as shown in FIG. 2I. The third etching step S53 may include exposing the interlayer insulating layer 3 and expanding a space SP1 between the first mask patterns 7k, as shown in FIG. 2J. As a result, the upper portions of the first mask patterns 7k may be spaced apart from each other by a third distance DS3, which is larger than the second distance DS2, as shown in FIG. 2J. As a result, the grooves GR may be formed. The grooves GR may be line-shaped regions elongated in a specific direction. The first mask patterns 7k may have side surfaces 7k_S that are inclined at an angle, and an inclination angle of the side surfaces 7k_S relative to a top surface of the porous dielectric layer 5 may become small.

Top surfaces of the first mask pattern 7k may be at a first height H1 from a bottom of the groove GR. In an implementation, a reciprocal aspect ratio of the groove GR including the space SP1 may be 2.0 to 2.8, e.g., 2.2 to 2.6. The reciprocal aspect ratio of the groove GR is a value that is given by dividing the first height H1 by the third distance DS3 (H1/DS3).

Figure 3:
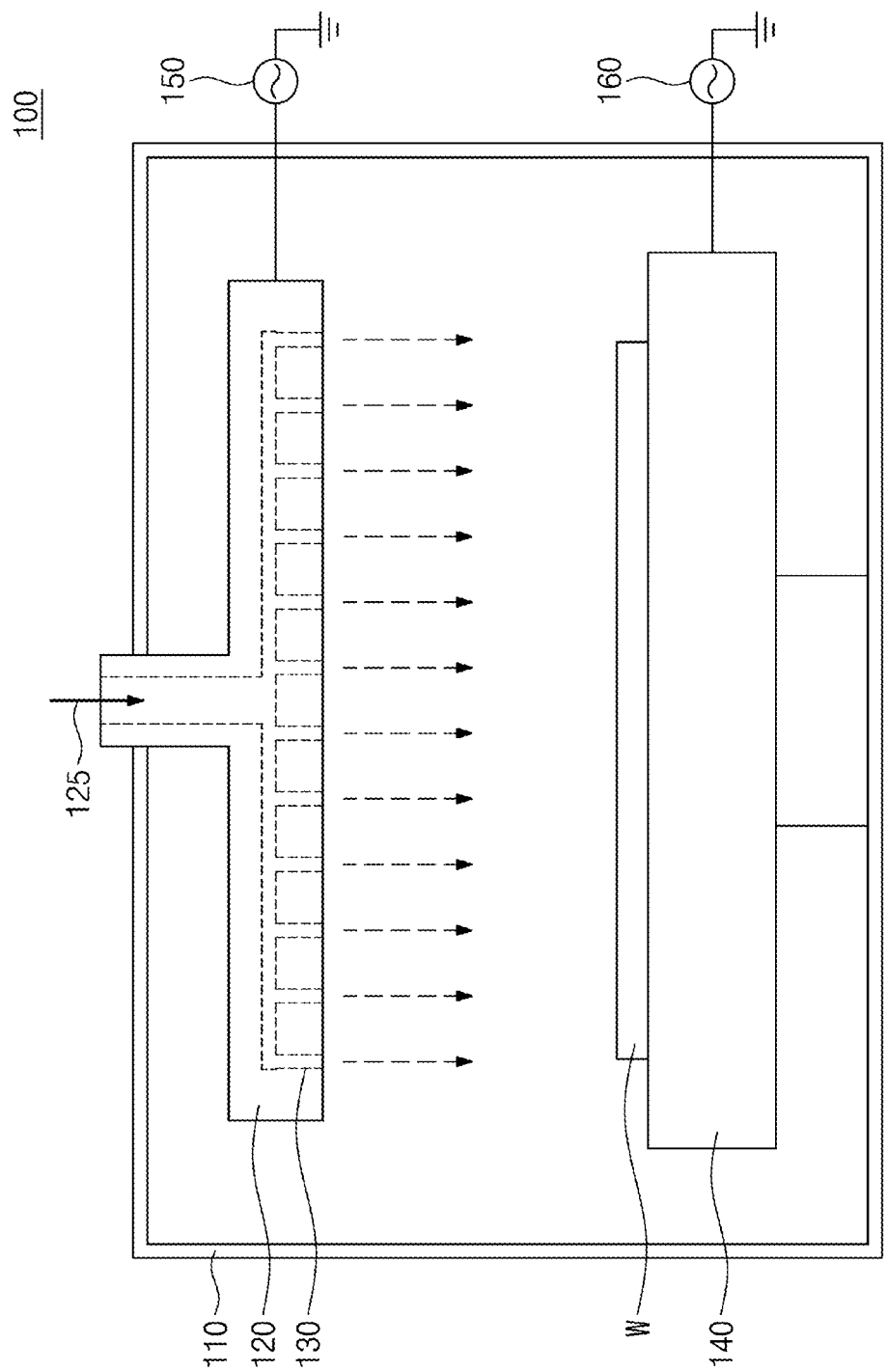
FIG. 3 is a sectional view of an etching chamber according to an embodiment.

FIG. 3 is a sectional view of an etching chamber according to an embodiment.

Referring to FIGS. 1, 2H to 2J, and 3, the first to third etching steps S51, S52, and S53 may be performed in an etching apparatus 100 of FIG. 3. The etching apparatus 100 may include a chamber 110, a chuck 140 (in the chamber 110 and used to load a wafer W), and an etching gas supplying part 120, which is on or over the chuck 140. A plurality of holes 130 may be in the etching gas supplying part 120 and may be used to supply etchants 125 into the etching apparatus 100. The etching gas supplying part 120 may be connected to a source power portion 150, and the chuck 140 may be connected to a bias power portion 160. The source power portion 150 may apply a source power to the etching gas supplying part 120, and in this case, the etchants 125 may be excited to be in a plasma state. The bias power portion 160 may apply a bias power to the chuck 140, and in this case, the etchants 125 in the plasma state may be accelerated toward the chuck 140. The etchants 125 may include a first etchant and a second etchant. In an implementation, the first etchant may include, e.g., $C_aF_b$. In an implementation, each of the subscripts a and b may be a natural number. In an implementation, the second etchant may include, e.g., $C_xH_yF_z$. In an implementation, each of the subscripts x, y, and z may be a natural number.

The first to third etching steps S51, S52, and S53 may be respectively performed under different process conditions. In an implementation, the process condition for the first etching step may be represented in terms of a first source power, a first bias power, a first etchant supplying amount, and a second etchant supplying amount. The process condition for the second etching step may be represented in terms of a second source power, a second bias power, the first etchant supplying amount, and the second etchant supplying amount. The process condition for the third etching step may be represented in terms of a third source power, a third bias power, the first etchant supplying amount, and the second etchant supplying amount.

In an implementation, in all of the first to third etching steps (in S51, S52, and S53), a supplying amount of the first etchant may be the same. In an implementation, the supplying amount of the second etchant in the first etching step S51 may be greater than the supplying amount of the second etchant in the second and third etching steps S52 and S53. In an implementation, the second mask patterns 9k may be more quickly etched and removed in the first etching step S51.

In an implementation, the first source power may be equal to the second source power, and the first bias power may be equal to the second bias power. In an implementation, the third source power may be greater than the second source power, and the third bias power may be smaller than the second bias power. The third source power may be greater than the second source power, and the plasma excitation of the etchants may be more effectively activated. In an implementation, the third bias power may be smaller than the second bias power, the anisotropic acceleration of the etchants toward the chuck 140 may be suppressed and, in this case, the etch rate may be increased at an entrance portion of the groove GR and may be decreased at a bottom portion of the groove GR. In an implementation, in the third etching step S53, it may be possible not only to reduce the thickness of the first mask patterns 7k, but also to expand the space SP1 between the first mask patterns 7k. Furthermore, it may be possible to reduce etch damage to the interlayer insulating layer 3 at the bottom portion of the groove GR.

In an implementation, the first to third etching steps S51, S52, and S53 may be performed under different process conditions as described above, and the grooves GR may be formed to have a reciprocal aspect ratio of 2.8 or smaller, without a process failure.

Figure 2K:
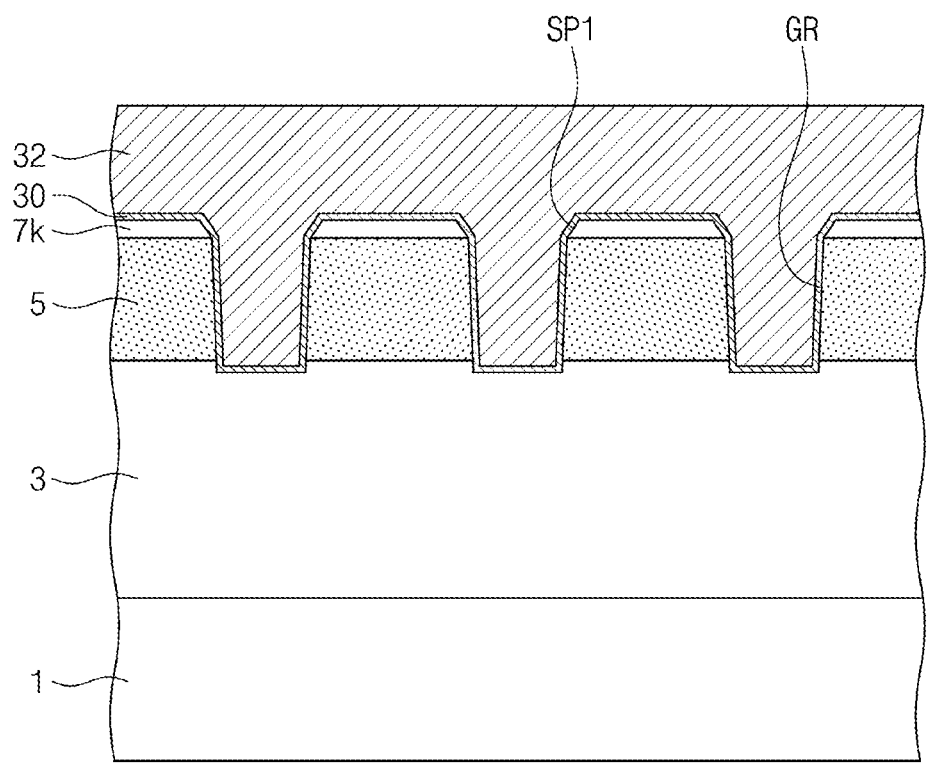

Referring to FIG. 2K, a barrier layer 30 may be conformally formed on the resulting structure with the grooves GR. In an implementation, the barrier layer 30 may be formed of or include, e.g., titanium, tantalum, titanium nitride, tantalum nitride, or tungsten nitride. In an implementation, a seed layer may be conformally formed on the barrier layer 30. The seed layer may be formed of or include, e.g., copper. A metal layer 32 may be formed on the seed layer to fill the grooves GR. In an implementation, the grooves GR may have a reciprocal aspect ratio of 2.8 or smaller, and a void may not be formed in the metal layer 32 in the grooves GR.

Figure 2L:
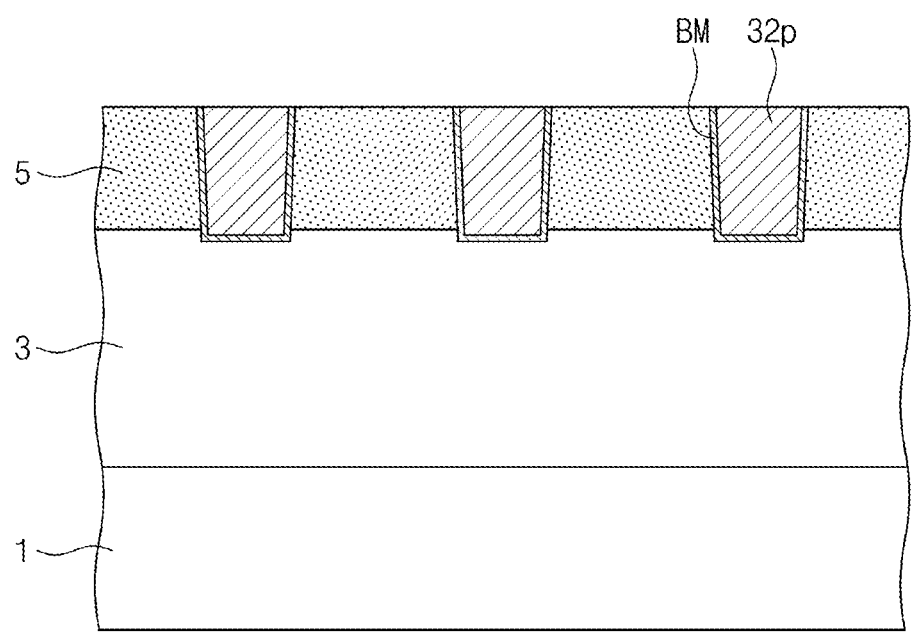

Referring to FIGS. 1 and 2L, a chemical mechanical polishing (CMP) process may be performed on the metal layer 32 to form interconnection patterns 32p in the grooves GR. During the CMP process, the barrier layer 30 may also be etched to form a barrier pattern BM. In an implementation, during the CMP process, the first mask patterns 7k may also be removed to expose the top surface of the porous dielectric layer 5. The interconnection patterns 32p may be line-shaped patterns extending in a specific direction. In an implementation, the interconnection patterns 32p may be spaced apart from each other by the same distance. The interconnection patterns 32p may be formed to have the same width. The interconnection patterns 32p may be formed to have a reciprocal aspect ratio of 1.5-2.8, e.g., 1.5-2.6, or 1.5-2.3.

In an implementation, in the fabrication method, as described with reference to FIGS. 2C, 2D, 2F, and 2G, due to the first mask layer 7, the porous dielectric layer 5 may not be exposed to the ashing process, and thus, it may be possible to prevent the porosity of the porous dielectric layer 5 from being lowered. In addition, only the groove GR may be formed in the porous dielectric layer 5, and it may be possible to relatively suppress etch damage to the porous dielectric layer 5. Accordingly, it may be possible to minimize a reduction in porosity of the porous dielectric layer 5. As a result, the dielectric constant of the porous dielectric layer 5 may be maintained at a value of, e.g., 3.2, which is lower than the dielectric constant (i.e., 3.6) of the silicon oxide. This may make it possible to reduce or minimize a parasitic capacitance between the interconnection patterns 32p, an interference issue between the interconnection patterns 32p, and a signal noise failure.

In the fabrication method according to an embodiment, the first mask layer 7 may be formed of carbon-free silicon oxide ($SiO_2$), rather than a metallic or metal-containing material (e.g., TiN). As a result, the first mask patterns 7k, which are remaining portions of the first mask layer 7, may also be formed of the carbon-free silicon oxide ($SiO_2$).

If the first mask patterns were to be formed of a metallic material (e.g., TiN), it may be difficult to control an etch rate of the TiN layer, and this could cause a difficulty in normally performing the first to third etching steps according to an embodiment. In this case, it may be difficult to reduce the thickness of the first mask patterns and to increase the distance between the upper portions of the first mask patterns, and as a result, the reciprocal aspect ratio of the grooves may be increased to a value of, e.g., about 3.1 or greater (e.g., greater than 3.2). If the grooves were formed to have a reciprocal aspect ratio greater than 2.8, a void could be formed in the metal layer in the grooves, and this void may be exposed after a subsequent CMP process on the metal layer. In this case, a foreign material could be left in the void, thereby causing a failure in a process of fabricating or operating a semiconductor device.

By contrast, according to an embodiment, the first mask patterns 7k may be formed of the carbon-free silicon oxide ($SiO_2$), and the first to third etching steps described above may be performed to form the grooves GR having a reciprocal aspect ratio of 2.8 or less. Accordingly, it may be possible to prevent the void from being formed in the metal layer 32 in the grooves GR, and thereby to improve the reliability of the semiconductor device.

Furthermore, according to the other methods, a protection layer or the like may be formed on the side surface of the groove GR to help prevent the porous dielectric layer from being damaged in the ashing process and/or the etching process. By contrast, according to an embodiment, the first mask patterns 7k may be formed of the carbon-free silicon oxide ($SiO_2$), the process may be performed in the aforedescribed manner, and the protection layer may not be required. This may make it possible to simplify the fabrication process and to increase production yield in the fabrication process.

FIGS. 4A to 4F are sectional views of stages in a method of fabricating a semiconductor device according to an embodiment. FIG. 5 is a plan view of a semiconductor device according to an embodiment.

Figure 4A:
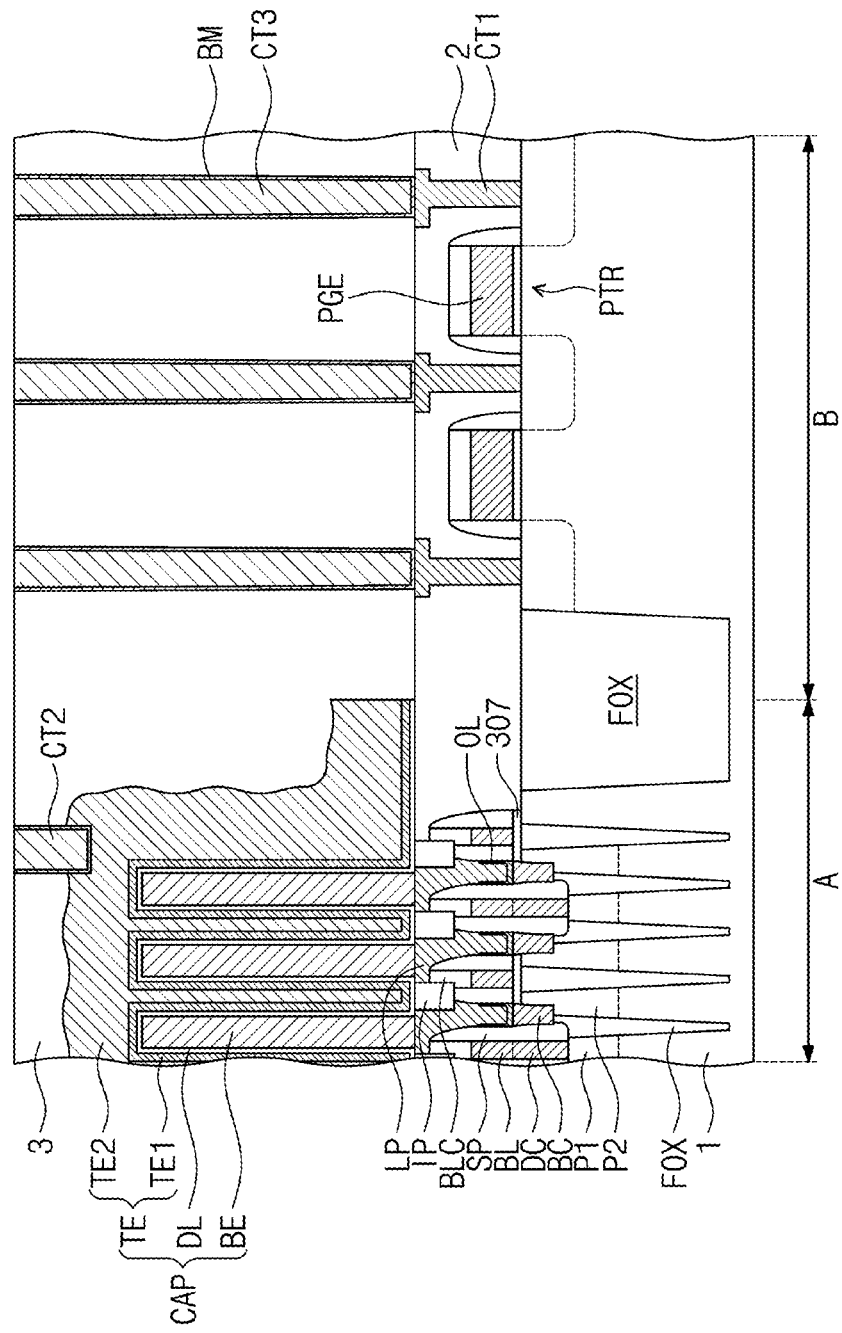
FIGS. 4A to 4F are sectional views of stages in a method of fabricating a semiconductor device according to an embodiment.

Referring to FIG. 4A, the substrate 1 may be provided. In an implementation, the substrate 1 may be a single-crystalline silicon substrate or a SOI substrate. The substrate 1 may have a first region A and a second region B. In FIGS. 4A to 4F, the first region A may be a cell array region and may correspond to a section taken along a line R1-R1' of FIG. 5. In FIGS. 4A to 4F, the second region B may be a peripheral circuit region and may correspond to a section taken along a line R2-R2' of FIG. 5.

The second region B may be near or around the first region A. Peripheral circuits, which are used to drive word lines WL and bit lines BL on the first region A, may be on the second region B. The second region B may be referred to as a core region or a peripheral circuit region.

Referring to FIGS. 4A and 5, a device isolation layer FOX may be in the substrate 1 to define cell active portions ACTC and a peripheral active portion ACTP. Each of the cell active portions ACTC may have an isolated shape. Each of the cell active portions ACTC may be a bar-shaped pattern elongated in a first direction D1, when viewed in a plan view. The device isolation layer FOX may include an oxide liner, a nitride liner, and an insulating gapfill layer. The cell active portions ACTC may be arranged to be parallel to each other and to be parallel to the first direction D1, and each cell active portion ACTC may have an end portion that is adjacent to a center of another cell active portion ACTC adjacent thereto.

In an implementation, the word lines WL may be buried in the substrate 1 and may cross the cell active portions ACTC. The word lines WL may be in word line grooves, respectively, which are formed in the device isolation layer FOX and the cell active portions ACTC. The word lines WL may be parallel to a second direction D2 crossing the first direction D1.

A first impurity region P1 may be in a region of each cell active portion ACTC, which is located between a pair of the word lines WL, and a pair of second impurity regions P2 may be respectively in opposite edge regions of each cell active portion ACTC. The first and second impurity regions P1 and P2 may be doped with impurities of an n type. The first impurity region P1 may correspond to a common drain region, and the second impurity region P2 may correspond to a source region.

A first interlayer insulating layer 307 may be on the first region A of the substrate 1. The first interlayer insulating layer 307 may be formed of or include, e.g., silicon oxide, silicon nitride, or silicon oxynitride layer, and may have a single-layer or multi-layered structure.

The bit lines BL may be on the first interlayer insulating layer 307. The bit lines BL may cross the word lines WL. As shown in FIG. 5, the bit lines BL may be parallel to a third direction D3 crossing the first and second directions D1 and D2. The bit lines BL may include, e.g., a doped poly-silicon layer, a metal nitride layer, or a metal layer. A bit line capping pattern BLC may be on the bit line BL. In an implementation, the bit line capping pattern BLC may be formed of or include, e.g., silicon nitride.

A bit line spacer SP may cover a side surface of the bit line BL. The bit line spacer SP may be formed of or include, e.g., silicon nitride, silicon oxide, or silicon oxynitride, and may have a single-layer or multi-layered structure. In an implementation, an air gap may be formed in the bit line spacer SP.

The bit line BL may be electrically connected to the first impurity region P1 through a bit line contact DC. In an implementation, the bit line contact DC may be formed of or include, e.g., doped polysilicon.

Storage node contacts BC may be between an adjacent pair of the bit lines BL. The storage node contacts BC may be spaced apart from each other. The storage node contacts BC may be formed of or include, e.g., doped polysilicon. The storage node contacts BC may be island-shaped isolated patterns, which are spaced apart from each other. The storage node contacts BC may penetrate the first interlayer insulating layer 307 and may be in contact with the second impurity regions P2.

Landing pad LP may be on the storage node contact BC. The landing pad LP may be formed of or include, e.g., a material containing a metal element (e.g., tungsten, aluminum, or copper). An upper portion of the landing pad LP may cover a top surface of the bit line capping pattern BLC. A center of the landing pad LP may be shifted from a center of the storage node contact BC in an opposite direction of the second direction D2. A portion of the bit line BL may be vertically overlapped with the landing pad LP. An ohmic layer OL may be between the storage node contact BC and the landing pad LP. The ohmic layer OL may be formed of or include, e.g., a metal silicide material.

Adjacent ones of the landing pads LP may be spaced apart from each other by a landing pad separation pattern IP. The landing pad separation pattern IP may be formed of or include, e.g., silicon nitride, silicon oxide, or silicon carbon nitride, and may have a single-layer or multi-layered structure.

Bottom electrodes BE may be in contact with the landing pads LP. The bottom electrodes BE may be formed of or include, e.g., doped polysilicon or titanium nitride. In an implementation, a supporting pattern may be in partial contact with upper side surfaces of the bottom electrodes BE. A dielectric layer DL may cover the bottom electrodes BE. The dielectric layer DL may be formed of or include, e.g., a metal oxide material. A top electrode TE may be on the dielectric layer DL. The top electrode TE may include a first top electrode layer TE1 and a second top electrode layer TE2 which are sequentially stacked. The first top electrode layer TE1 may be formed of or include, e.g., titanium nitride. The second top electrode layer TE2 may be formed of or include, e.g., doped silicon germanium. Due to grains of silicon germanium, the second top electrode layer TE2 may have an uneven surface. The bottom electrodes BE, the dielectric layer DL, and the top electrode TE may constitute a capacitor CAP.

The device isolation layer FOX may be between the first region A and the second region B. A peripheral gate electrode 323*b* may be on the second region B of the substrate 1. A peripheral gate insulating pattern 309*b* may be between the peripheral gate electrode 323*b* and the substrate 1. Peripheral transistors PTR, each of which includes a peripheral gate electrode PGE, may be on the second region B of the substrate 1. The peripheral gate electrode PGE may be covered with a first lower interlayer insulating layer 2. Lower contacts CT1 may penetrate the first lower interlayer insulating layer 2 and may be in contact with the source/drain regions of the peripheral transistors PTR. A second lower interlayer insulating layer 3 may be on the first lower interlayer insulating layer 2. The second lower interlayer insulating layer 3 may cover the capacitor CAP and may have a flat top surface. A first upper contact CT2 and second upper contacts CT3 may be in the second lower interlayer insulating layer 3. The first upper contact CT2 may penetrate the second lower interlayer insulating layer 3 and may be in contact with the second top electrode layer TE2. The second upper contacts CT3 may penetrate the second lower interlayer insulating layer 3 and may be in contact with the lower contacts CT1. The second upper contacts CT3 may be metal contacts. Side and bottom surfaces of each of the first and second upper contacts CT2 and CT3 may be covered with the barrier pattern BM.

Figure 4B:
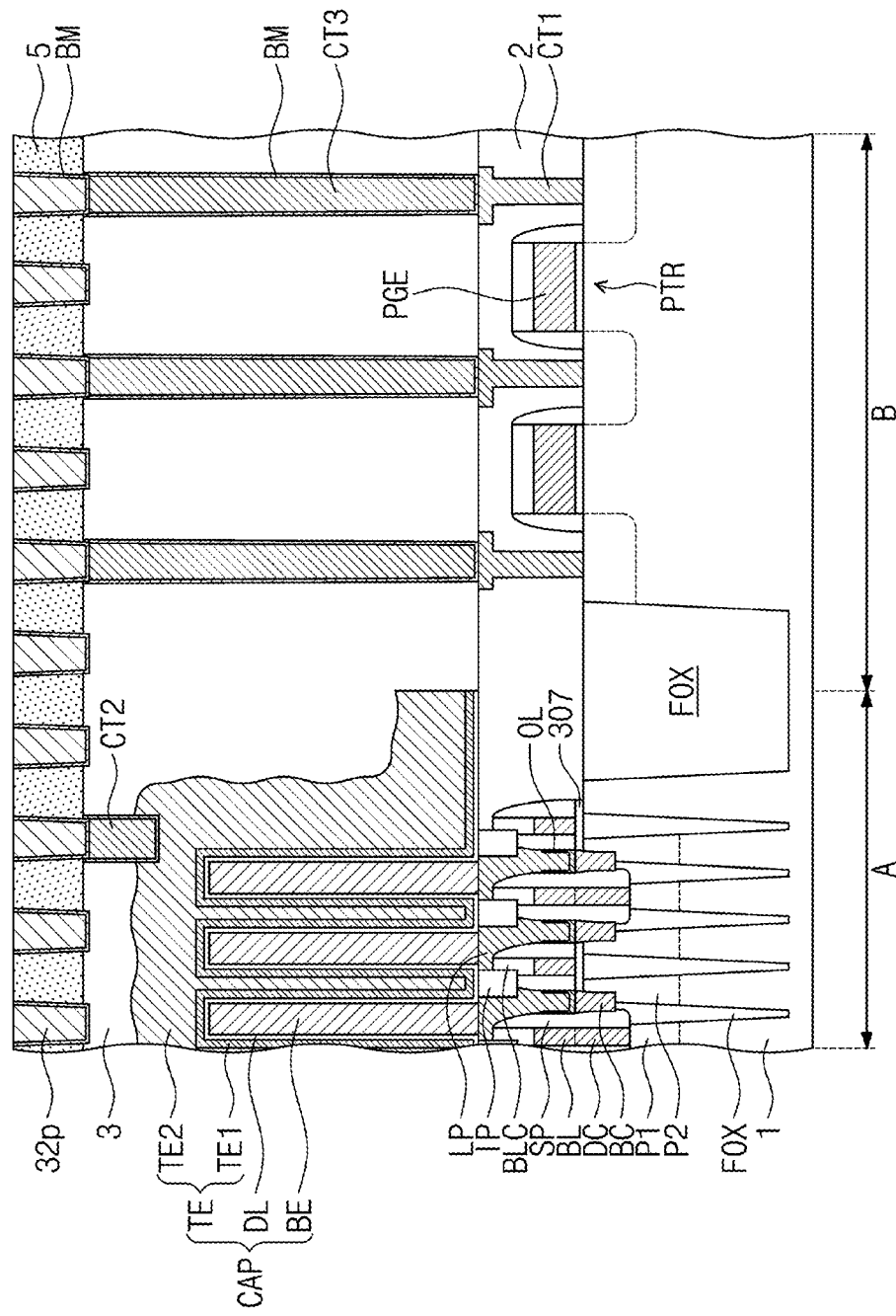
Figure 5:
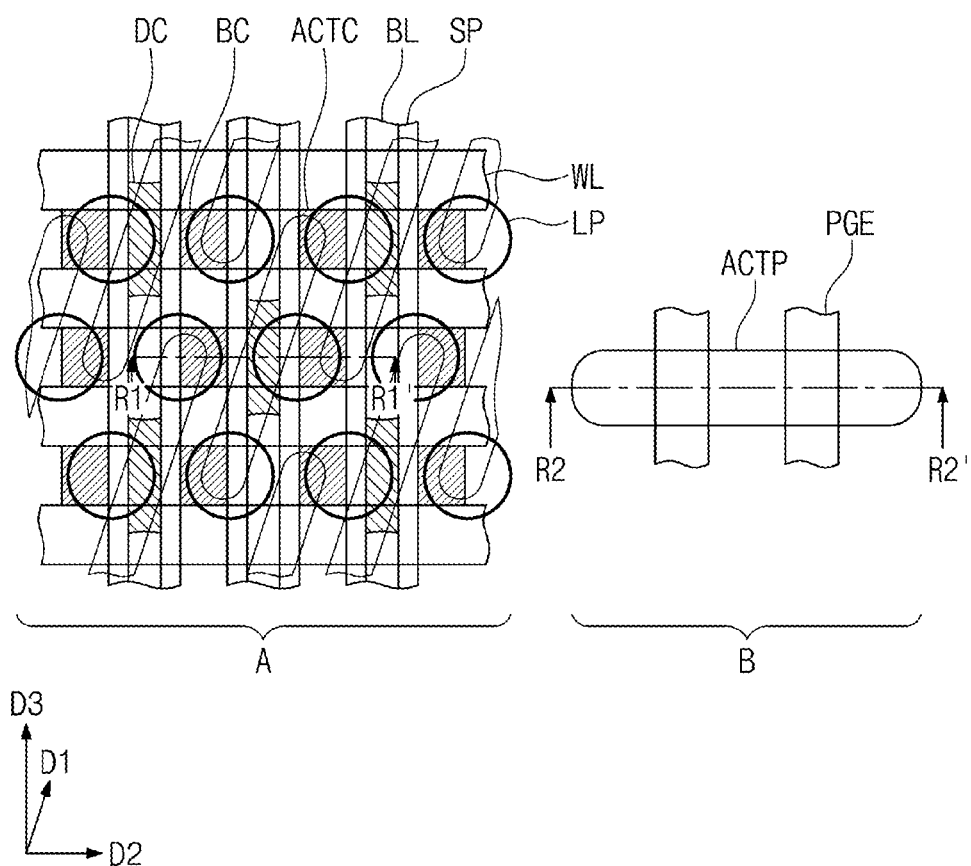
FIG. 5 is a plan view of a semiconductor device according to an embodiment.

Referring to FIG. 4B, the first porous dielectric layer 5 may be formed on the second lower interlayer insulating layer 3. The second lower interlayer insulating layer 3 may correspond to the interlayer insulating layer 3 described with reference to FIGS. 2A to 2L. The first porous dielectric layer 5 may correspond to the porous dielectric layer 5 described with reference to FIGS. 2A to 2L. The first interconnection patterns 32p may be formed in the first porous dielectric layer 5 through the method described with reference to FIGS. 1 and 2A to 2L. The first interconnection patterns 32p may correspond to the interconnection patterns 32p described with reference to FIG. 2L. The first interconnection patterns 32p may have an increasing width, with increasing distance from the substrate 1.

Figure 4C:
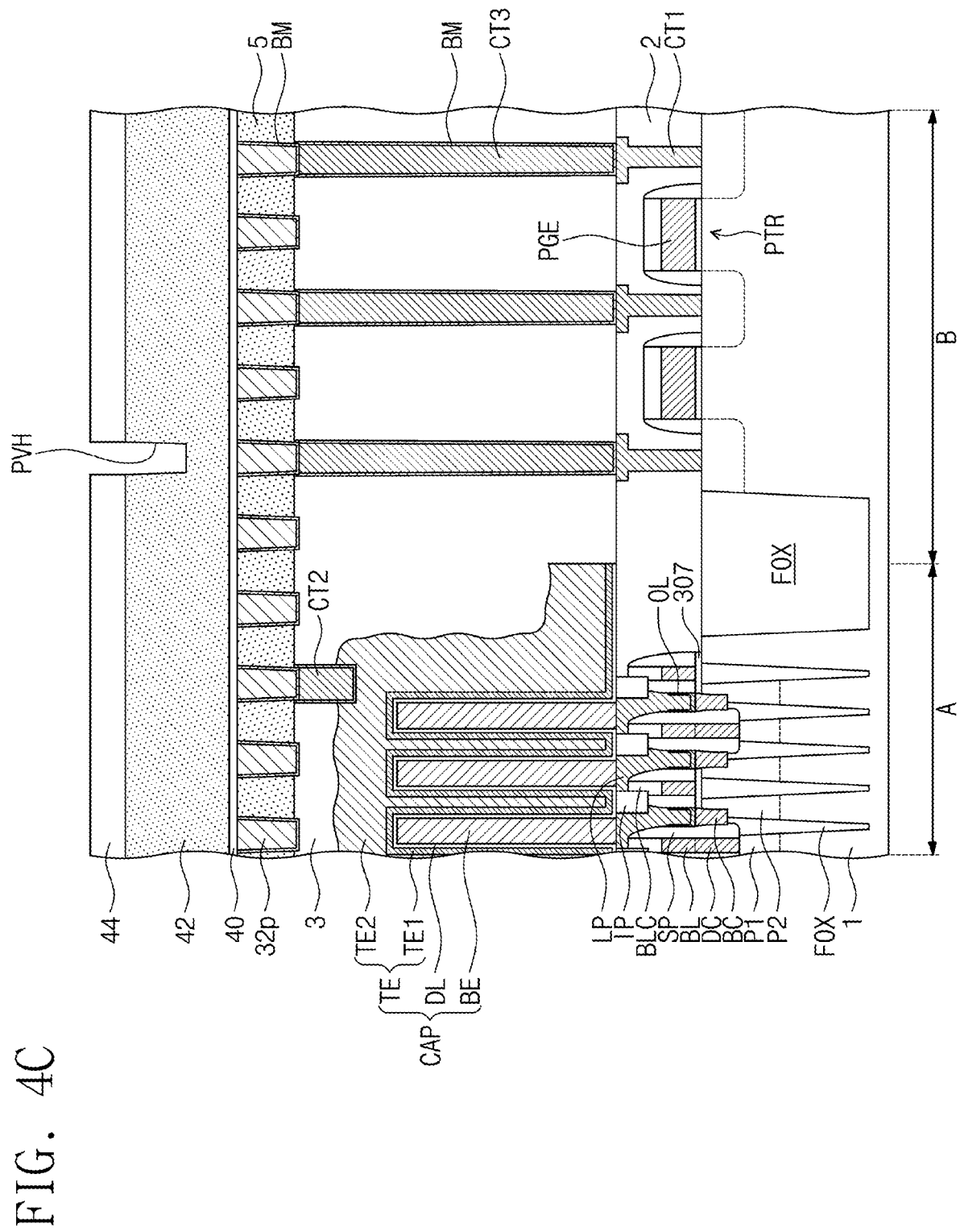

Referring to FIG. 4C, a first etch stop layer 40 may be formed on the first porous dielectric layer 5. The first etch stop layer 40 may be formed of or include, e.g., silicon nitride or aluminum oxide. A second porous dielectric layer 42 may be formed on the first etch stop layer 40. A thickness of the second porous dielectric layer 42 may be larger than a thickness of the first porous dielectric layer 5. Third mask patterns 44 may be formed on the second porous dielectric layer 42. The third mask patterns 44 may have an opening, which will be used to define a position and shape of a via hole VH of FIG. 4D. A preliminary via hole PVH may be formed by etching the second porous dielectric layer 42 to a specific depth using the third mask patterns 44 as an etch mask. The etching process could cause first damage on the second porous dielectric layer 42.

Figure 4D:
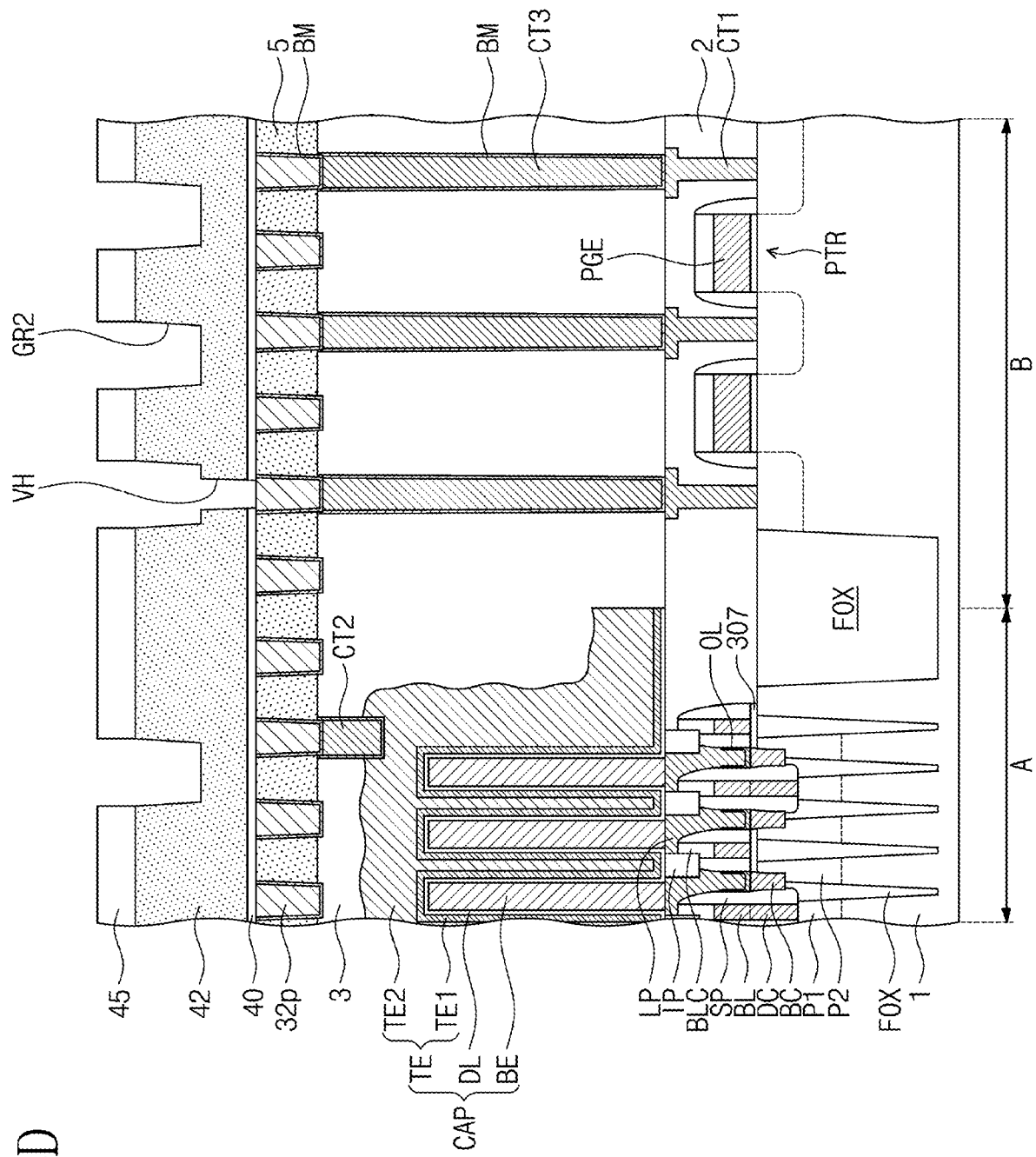

Referring to FIGS. 4C and 4D, the third mask patterns 44 may be removed. At this time, the second porous dielectric layer 42 could be secondly damaged. In an implementation, fourth mask patterns 45 may be formed on the second porous dielectric layer 42. The fourth mask patterns 45 may have openings delimiting second grooves GR2. The fourth mask patterns 45 may be formed so as not to be overlapped with the preliminary via hole PVH. The second grooves GR2 may be formed by etching the second porous dielectric layer 42 using the fourth mask patterns 45 as an etch mask. In an implementation, the second porous dielectric layer 42 below the preliminary via hole PVH may be further etched to form the via hole VH, which is overlapped with one of the second grooves GR2. The via hole VH may expose one of the second upper contacts CT3. When the second grooves GR2 are formed, the second porous dielectric layer 42 could be thirdly damaged.

Figure 4E:
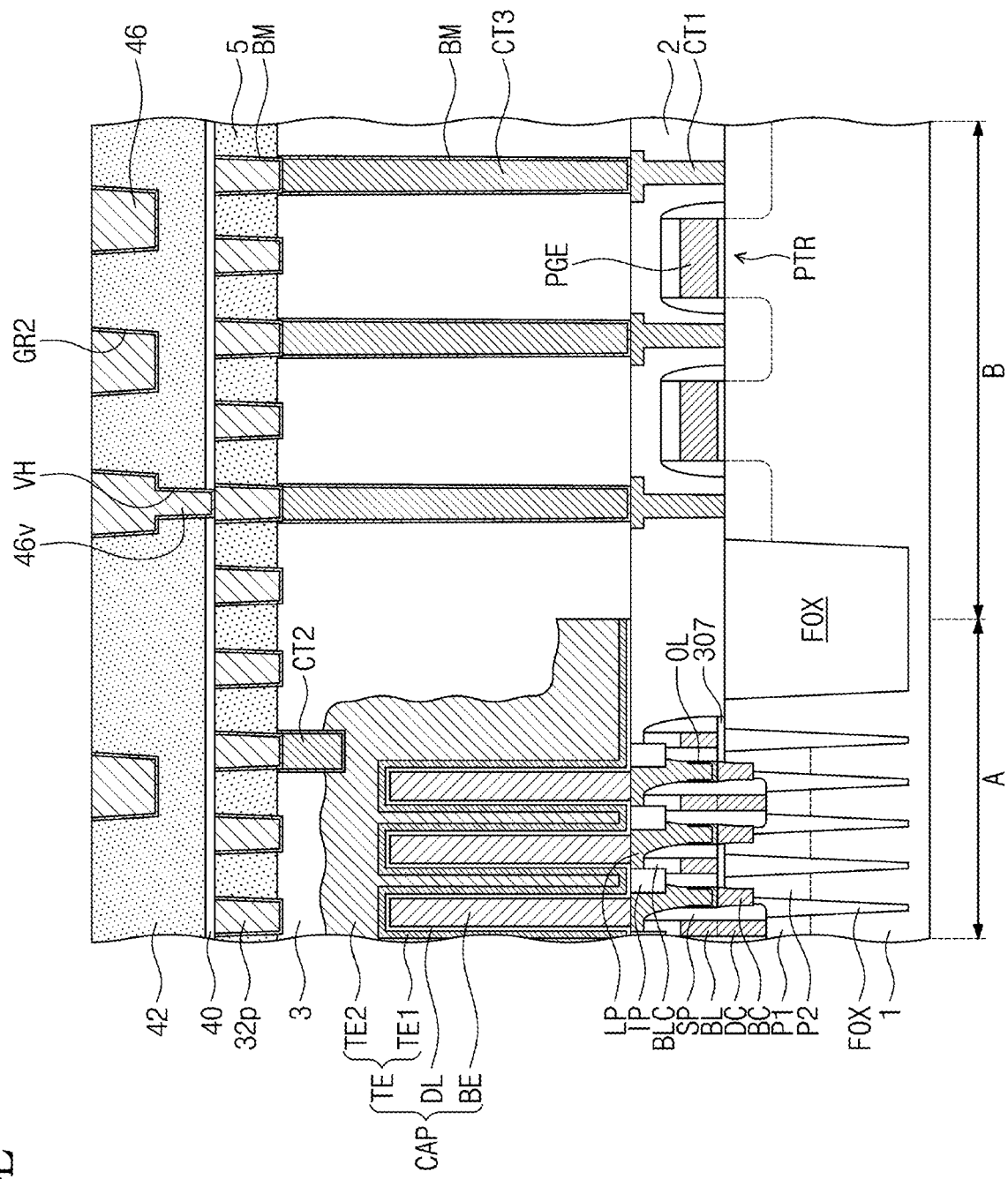

Referring to FIGS. 4D and 4E, a barrier layer and a metal layer may be sequentially stacked on a resulting structure with the second grooves GR2 and the via hole VH, and a CMP process may be performed to form second interconnection patterns 46 in the second grooves GR2. In an implementation, a via pattern 46v may be formed in the via hole VH. The via pattern 46v and one of the second interconnection patterns 46 may be formed to constitute a single object (e.g., a monolithic structure). During the CMP process, the fourth mask patterns 45 may be removed to expose the second porous dielectric layer 42. The second interconnection patterns 46 may have an increasing width, with increasing distance from the substrate 1.

The second porous dielectric layer 42 may be damaged three times, as described with reference to FIGS. 4C to 4E. In an implementation, the second porous dielectric layer 42 may have a lowered porosity and an increased dielectric constant. By contrast, the first porous dielectric layer 5 may be less damaged by the ashing or etching process, as described with reference to FIGS. 1 to 2L. In an implementation, the porosity of the second porous dielectric layer 42 may be smaller than the porosity of the first porous dielectric layer 5. A dielectric constant of the second porous dielectric layer 42 may be increased to a value that is greater than the dielectric constant of the first porous dielectric layer 5.

Figure 4F:
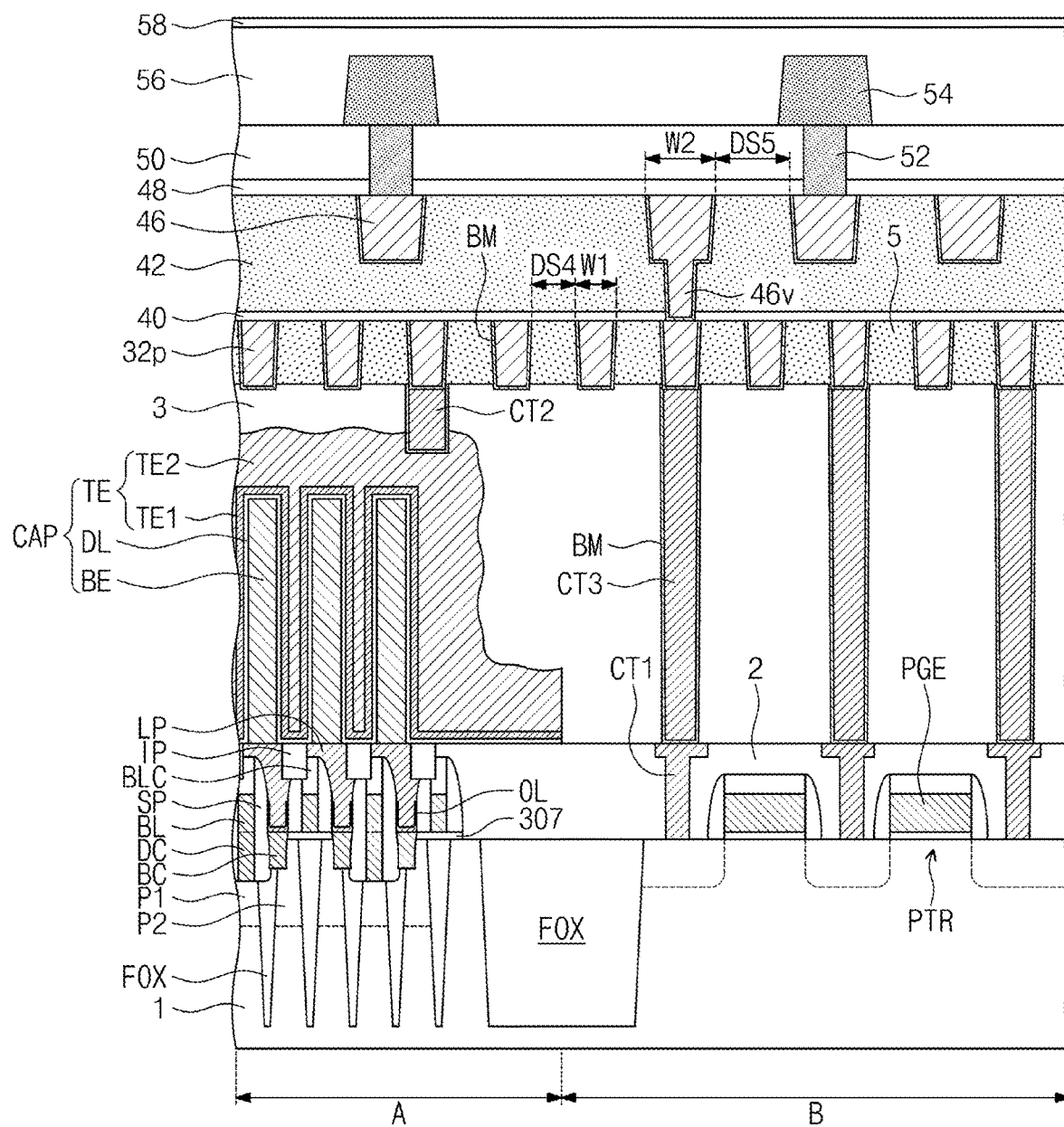

Referring to FIG. 4F, a second etch stop layer 48 may be formed on the second porous dielectric layer 42. The second etch stop layer 48 may be formed of or include, e.g., silicon nitride or aluminum oxide. Each of the first and second etch stop layers 40 and 48 may serve as not only an etch stop layer but also a hydrogen blocking layer. Accordingly, it may be possible to improve the reliability of the semiconductor device. To help improve the hydrogen blocking function of the second etch stop layer 48, the second etch stop layer 48 may be thicker than the first etch stop layer 40.

A first upper interlayer insulating layer 50 may be formed on the second etch stop layer 48. An upper via 52 may be formed by etching the first upper interlayer insulating layer 50 to form an upper via hole and filling the upper via hole with a conductive material. The upper via 52 may be formed of or include, e.g., tungsten.

Upper interconnection lines 54 may be formed by forming a conductive layer on the first upper interlayer insulating layer 50 and etching the conductive layer. The upper interconnection lines 54 may have an increasing width, with decreasing distance from the substrate 1. The upper interconnection lines 54 may be formed of or include, e.g., aluminum. A second upper interlayer insulating layer 56 may be formed on the first upper interlayer insulating layer 50 to cover the upper interconnection lines 54. A passivation layer 58 may be formed on the second upper interlayer insulating layer 56. The first upper interlayer insulating layer 50 and the second upper interlayer insulating layer 56 may be formed of or include, e.g., silicon oxide. The passivation layer 58 may be formed of or include, e.g., silicon oxide.

Referring to FIG. 4F, the first interconnection patterns 32p may connect lower structures (e.g., the word line WL, the bit line BL, the top electrode TE, the peripheral transistor PTR, and so forth) to the second interconnection patterns 46. In an implementation, a density of the lower structures may be very high, and the first interconnection patterns 32p may have a pattern density that is higher than a pattern density of the second interconnection patterns 46. In an implementation, the number of the first interconnection patterns 32p per unit area may be greater than the number of the second interconnection patterns 46 per unit area. Thus, the first interconnection patterns 32p may have a width W1 that is smaller than a width W2 of the second interconnection patterns 46, and a distance DS4 between the first interconnection patterns 32p may be reduced to a value smaller than a distance DS5 between the second interconnection patterns 46. In the case where other methods are used for forming such a structure, an interference issue between the first interconnection patterns 32p could be deepened. However, in the case where the fabrication method according to an embodiment is performed, it may be possible to reduce or minimize the damage of the first porous dielectric layer 5, in which the first interconnection patterns 32p are disposed, as described above, and thereby to prevent or minimize the porosity of the first porous dielectric layer 5 from being lowered. Accordingly, the dielectric constant of the first porous dielectric layer 5 may be lowered, and thus, it may be possible to minimize an interference issue between the first interconnection patterns 32p. Thus, it may be possible to improve the reliability of the semiconductor device.

In an implementation, the first porous dielectric layer 5 may have a dielectric constant of 2.7 to 3.2. The first porous dielectric layer 5 may have a porosity of about 5% to about 10%. The dielectric constant of the first porous dielectric layer 5 may be smaller than the dielectric constant of the second porous dielectric layer 42. The porosity of the first porous dielectric layer 5 may be higher than the porosity of the second porous dielectric layer 42. Each of the first interconnection patterns 32p may have a reciprocal aspect ratio of 1.5 to 2.8. In FIG. 4F, a structure below the second lower interlayer insulating layer 3 may have the same features as those described with reference to FIGS. 4A and 5.

By way of summation and review, to increase the integration density of a semiconductor device, linewidths of patterns constituting the semiconductor device may be reduced. However, complicated or expensive exposure technologies may be needed to reduce the linewidths of the patterns, and it may be difficult to increase the integration density of the semiconductor device. Accordingly, increasing integration density of a semiconductor device may be considered.

One or more embodiments may provide a method capable of minimizing a damage issue of a porous dielectric layer in a process of fabricating a semiconductor device and simplifying the fabrication process.

One or more embodiments may provide a semiconductor device with improved reliability.

In a method of fabricating a semiconductor device according to an embodiment, a mask layer directly on a porous dielectric layer may be formed of carbon-free silicon oxide, and thus, it may be possible to help prevent the porous dielectric layer from being damaged by an ashing process.

Furthermore, only an etching process to form grooves may be performed on the porous dielectric layer, in which interconnection patterns with a relatively high pattern density are to be formed, and this may make it possible to help minimize etch damage to the porous dielectric layer. In addition, it may be unnecessary to form a protection layer covering a side surface of the groove, and thus, the fabrication process may be simplified. Furthermore, this may make it possible to increase yield in the fabrication process.

In addition, a mask pattern, which is used to form the grooves in the porous dielectric layer, may be formed of carbon-free silicon oxide, and in this case, the mask pattern may have excellent etch selectivity with respect to the porous dielectric layer, and it may be possible to stably form the grooves without a failure issue. Also, the groove may be formed to have a high reciprocal aspect ratio, and it may be possible to prevent a void from being formed in a metal layer and thereby to prevent a process failure from occurring.

In a semiconductor device according to an embodiment, the porous dielectric layer having relatively high porosity and low dielectric constant may be between the interconnection patterns with a relatively high pattern density, and it may be possible to reduce a parasitic capacitance between the interconnection patterns. This may make it possible to help suppress a signal noise failure and to improve reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   sequentially stacking an interlayer insulating layer, a porous dielectric layer, a first mask layer, and a second mask layer on a substrate;
   etching the second mask layer to form preliminary mask patterns;
   etching the preliminary mask patterns to form second mask patterns;
   etching the first mask layer using the second mask patterns as an etch mask to form first mask patterns;
   etching the porous dielectric layer using the first mask patterns as an etch mask to form grooves; and
   forming interconnection patterns in the grooves, respectively, wherein:
   the porous dielectric layer includes SiOCH, and
   the first mask layer includes carbon-free silicon oxide ($SiO_2$), and
   wherein etching the second mask layer to form the preliminary mask patterns includes:
      sequentially forming a first sacrificial mask layer and a second sacrificial mask layer on the second mask layer;
      forming first photoresist patterns on the second sacrificial mask layer such that the first photoresist patterns are spaced apart from each other by a first distance;
      sequentially etching the second sacrificial mask layer and the first sacrificial mask layer using the first photoresist patterns as an etch mask to form second sacrificial mask patterns and first sacrificial mask patterns; and
      forming the preliminary mask patterns using the first sacrificial mask patterns as an etch mask.

2. The method as claimed in claim 1, wherein:
   forming the first mask patterns reduces a thickness of the second mask patterns, and etching the porous dielectric layer includes:
   a first etching step of removing the second mask patterns having the reduced thickness;
   a second etching step of etching the porous dielectric layer to a depth such that the interlayer insulating layer is not exposed; and
   a third etching step of exposing the interlayer insulating layer and expanding a space between the first mask patterns.

3. The method as claimed in claim 2, wherein:
   etching the porous dielectric layer is performed in an etching apparatus,
   the second etching step includes applying a second source power and a second bias power to the etching apparatus,
   the third etching step includes applying a third source power and a third bias power to the etching apparatus,
   the third source power is greater than the second source power, and
   the third bias power is smaller than the second bias power.

4. The method as claimed in claim 3, wherein:
   the first etching step includes applying a first source power and a first bias power to the etching apparatus, the first source power is equal to the second source power, and the first bias power is equal to the second bias power.

5. The method as claimed in claim 2, wherein:

etching the porous dielectric layer includes supplying $C_xH_yF_z$, in which x, y, and z are each independently a natural number, and a supplying amount of the $C_xH_yF_z$ in the first etching step is greater than a supplying amount of the $C_xH_yF_z$ in the second etching step.

6. The method as claimed in claim 5, wherein:

etching the porous dielectric layer further includes supplying $C_aF_b$, in which a and b are each independently a natural number, and a supplying amount of the $C_aF_b$ in the first etching step is equal to a supplying amount of the $C_aF_b$ in the second etching step.

7. The method as claimed in claim 1, wherein etching the preliminary mask patterns to form the second mask patterns includes:

sequentially forming a third sacrificial mask layer and a fourth sacrificial mask layer on the preliminary mask patterns;

forming second photoresist patterns on the fourth sacrificial mask layer such that the second photoresist patterns are spaced apart from each other by the first distance and side surfaces of the second photoresist patterns are overlapped with the preliminary mask patterns;

sequentially etching the fourth sacrificial mask layer and the third sacrificial mask layer using the second photoresist patterns as an etch mask to form fourth sacrificial mask patterns and third sacrificial mask patterns; and etching the preliminary mask patterns using the third sacrificial mask patterns as an etch mask.

8. The method as claimed in claim 7, wherein:

the first sacrificial mask layer and the third sacrificial mask layer include the same material as each other, and the second sacrificial mask layer and the fourth sacrificial mask layer include the same material as each other.

9. A method of fabricating a semiconductor device, the method comprising:

sequentially stacking an interlayer insulating layer, a porous dielectric layer, a first mask layer, and a second mask layer on a substrate;

etching the second mask layer to form preliminary mask patterns;

etching the preliminary mask patterns to form second mask patterns;

etching the first mask layer using the second mask patterns as an etch mask to form first mask patterns;

etching the porous dielectric layer using the first mask patterns as an etch mask to form grooves; and forming interconnection patterns in the grooves, respectively, wherein:

forming the first mask patterns reduces a thickness of the second mask patterns, and etching the porous dielectric layer includes:

a first etching step of removing the second mask patterns having the reduced thickness;

a second etching step of etching the porous dielectric layer to a depth such that the interlayer insulating layer is not exposed; and a third etching step of exposing the interlayer insulating layer and expanding a space between the first mask patterns.

10. The method as claimed in claim 9, wherein:

the porous dielectric layer includes SiOCH, the first mask layer includes carbon-free silicon oxide ($SiO_2$), and the second mask layer includes silicon nitride.

11. The method as claimed in claim 9, wherein:

etching the porous dielectric layer is performed in an etching apparatus, the second etching step includes applying a second source power and a second bias power to the etching apparatus, the third etching step includes applying a third source power and a third bias power to the etching apparatus, the third source power is greater than the second source power, and the third bias power is smaller than the second bias power.

12. The method as claimed in claim 11, wherein:

the first etching step includes applying a first source power and a first bias power to the etching apparatus, the first source power is equal to the second source power, and the first bias power is equal to the second bias power.

13. The method as claimed in claim 9, wherein:

etching the porous dielectric layer includes supplying $C_xH_yF_z$, in which x, y, and z are each independently a natural number, and a supplying amount of the $C_xH_yF_z$ in the first etching step is greater than a supplying amount of the $C_xH_yF_z$ in the second etching step.

14. The method as claimed in claim 13, wherein:

etching of the porous dielectric layer further includes supplying $C_aF_b$, in which a and b are each independently a natural number, and a supplying amount of the $C_aF_b$ in the first etching step is equal to a supplying amount of the $C_aF_b$ in the second etching step.

15. A method of fabricating a semiconductor device, the method comprising:

sequentially stacking interlayer insulating layer, a porous dielectric layer, a first mask layer, and a second mask layer on a substrate;

etching the second mask layer to form preliminary mask patterns;

etching the preliminary mask patterns to form second mask patterns;

etching the first mask layer using the second mask patterns as an etch mask to form first mask patterns;

etching the porous dielectric layer using the first mask patterns as an etch mask to form grooves exposing the interlayer insulating layer; and forming interconnection patterns in the grooves, respectively, wherein etching the porous dielectric layer includes performing a first etching step, a second etching step, and a third etching step, the first etching step, the second etching step, and the third etching step being performed under different process conditions.

16. The method as claimed in claim 15, wherein:

forming the first mask patterns reduces a thickness of the second mask patterns, the first etching step includes removing the second mask patterns having the reduced thickness, the second etching step includes etching the porous dielectric layer to a depth such that the interlayer insulating layer is not exposed, and the third etching step includes exposing the interlayer insulating layer and expanding a space between the first mask patterns.

17. The method as claimed in claim 15, wherein:

etching the porous dielectric layer is performed in an etching apparatus, the second etching step includes applying a second source power and a second bias power to the etching apparatus, the third etching step includes applying a third source power and a third bias power to the etching apparatus, the third source power is greater than the second source power, and the third bias power is smaller than the second bias power.

18. The method as claimed in claim 15, wherein:

etching the porous dielectric layer includes supplying $C_xH_yF_z$, in which x, y, and z are each independently a natural number, and a supplying amount of the $C_xH_yF_z$ in the first etching step is greater than a supplying amount of the $C_xH_yF_z$ in the second etching step.

19. The method as claimed in claim 15, wherein:

the porous dielectric layer includes SiOCH, the first mask layer includes carbon-free silicon oxide ($SiO_2$), and the second mask layer includes silicon nitride.

* * * * *